(12) United States Patent
Ema et al.

(10) Patent No.: US 8,698,253 B2
(45) Date of Patent: Apr. 15, 2014

(54) SEMICONDUCTOR DEVICE WITH STI AND METHOD FOR MANUFACTURING THE SEMICONDUCTOR DEVICE

(71) Applicant: Fujitsu Semiconductor Limited, Yokohama (JP)

(72) Inventors: Taiji Ema, Yokohama (JP); Kazuhiro Mizutani, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/941,778

(22) Filed: Jul. 15, 2013

(65) Prior Publication Data

US 2013/0299892 A1 Nov. 14, 2013

Related U.S. Application Data

(60) Division of application No. 13/164,297, filed on Jun. 20, 2011, now Pat. No. 8,497,176, which is a division of application No. 12/343,831, filed on Dec. 24, 2008, now Pat. No. 7,986,015, which is a continuation of application No. PCT/JP2006/313083, filed on Jun. 30, 2006.

(51) Int. Cl.
*H01L 25/065* (2006.01)

(52) U.S. Cl.
USPC .......... 257/390; 257/501; 257/E25.016; 257/E27.102

(58) Field of Classification Search
None
See application file for complete search history.

(56) References Cited

U.S. PATENT DOCUMENTS

| | | | |
|---|---|---|---|
| 5,400,278 A | 3/1995 | Kunori et al. | |
| 5,538,912 A | 7/1996 | Kunori et al. | |
| 5,663,084 A * | 9/1997 | Yi et al. | 438/453 |
| 6,121,110 A | 9/2000 | Hong et al. | |
| 6,344,386 B1 | 2/2002 | Io | |
| 6,590,254 B2 * | 7/2003 | Tanaka | 257/315 |
| 6,621,117 B2 | 9/2003 | Araki et al. | |

(Continued)

FOREIGN PATENT DOCUMENTS

| | | |
|---|---|---|
| EP | 1612861 A1 | 1/2006 |
| JP | 6-232374 A | 8/1994 |

(Continued)

OTHER PUBLICATIONS

European Search Report dated Oct. 22, 2010, issued in corresponding European Patent Application No. 06767691.6.

(Continued)

*Primary Examiner* — Wensing Kuo
(74) *Attorney, Agent, or Firm* — Westerman, Hattori, Daniels & Adrian, LLP

(57) ABSTRACT

A semiconductor device includes: a semiconductor substrate having first and second areas; an STI isolation region being made of an isolation trench formed in the semiconductor substrate and an insulating film burying the isolation trench and defining a plurality of active regions in the first and second areas; a first structure formed on an area from the active region in the first area to a nearby STI isolation region and having a first height; and a second structure formed on an area from the active region in the second area to a nearby STI isolation region and having a second height, wherein the surface of the said STI isolation region in the first area is lower than the surface of said STI isolation region in the second area.

7 Claims, 17 Drawing Sheets

(56) References Cited

U.S. PATENT DOCUMENTS

| | | | |
|---|---|---|---|
| 6,921,947 | B2 | 7/2005 | Furuta et al. |
| 7,001,808 | B2 | 2/2006 | Tsukamoto et al. |
| 7,008,847 | B2 * | 3/2006 | Park .................... 438/264 |
| 7,095,074 | B2 | 8/2006 | Tsukamoto et al. |
| 7,119,412 | B2 | 10/2006 | Yamamoto |
| 7,432,163 | B2 | 10/2008 | Yajima |
| 7,709,347 | B2 | 5/2010 | Sakagami |
| 2002/0009851 | A1 | 1/2002 | Shukuri et al. |
| 2002/0014641 | A1 | 2/2002 | Shukuri et al. |
| 2002/0019100 | A1 | 2/2002 | Shukuri et al. |
| 2002/0021585 | A1 | 2/2002 | Maeda et al. |
| 2002/0093073 | A1 | 7/2002 | Mori et al. |
| 2004/0029323 | A1 | 2/2004 | Shimizu et al. |
| 2005/0035397 | A1 | 2/2005 | Otoi et al. |
| 2005/0106822 | A1 | 5/2005 | Lee et al. |
| 2005/0110071 | A1 | 5/2005 | Ema et al. |
| 2005/0127473 | A1 | 6/2005 | Sakagami |
| 2005/0186803 | A1 | 8/2005 | Umezawa et al. |
| 2005/0230781 | A1 | 10/2005 | Ema et al. |
| 2006/0035437 | A1 | 2/2006 | Mitsuhira et al. |
| 2006/0086971 | A1 | 4/2006 | Takahashi et al. |
| 2006/0134845 | A1 | 6/2006 | Pham et al. |
| 2006/0192245 | A1 | 8/2006 | Oosawa |

FOREIGN PATENT DOCUMENTS

| | | |
|---|---|---|
| JP | 11-177047 A | 7/1999 |
| JP | 2000-12676 A | 1/2000 |
| JP | 2000-252449 A | 9/2000 |
| JP | 2001-036048 A | 2/2001 |
| JP | 2001-332708 A | 11/2001 |
| JP | 2002-100673 A | 4/2002 |
| JP | 2003-078040 A | 3/2003 |
| JP | 2003-297950 A | 10/2003 |
| JP | 2005-142340 A | 6/2005 |
| JP | 2005-236083 A | 9/2005 |
| JP | 2006-032700 A | 2/2006 |
| TW | 536726 B | 6/2003 |
| WO | 2004-093192 A1 | 10/2004 |

OTHER PUBLICATIONS

International Search Report for PCT/JP2006/313083, dated Sep. 19, 2006.
Taiwanese Office Action dated Apr. 10, 2009, issued in corresponding Taiwanese Application No. 095123911.
Japanese Office Action dated Feb. 21, 2012, issued in corresponding Japanese Patent Application No. 2008-522261.
Written Opinion of the International Searching Authority, issued in corresponding International Application No. PCT/JP2009/056682.
Japanese Notice of Reasons of Rejection mailed Jun. 26, 2012, issued in corresponding Japanese Patent Application No. 2008-522261, w/ partial English translation.
Partial English translation only of JP 2003-297950, which was previously cited on Jun. 20, 2011.
Japanese Decision to Dismiss the Amendment dated Oct. 9, 2012, issued in corresponding Japanese patent application No. 2008-522261, w/ partial English translation.
Report of Reconsideration dated Apr. 23, 2013, issued in corresponding Japanese Patent Application No. 2008-522261 (w/partial translation).
The Extended European Search Report dated Sep. 6, 2013, issued in corresponding European Patent Application No. 13175277.6 (6 pages).

* cited by examiner

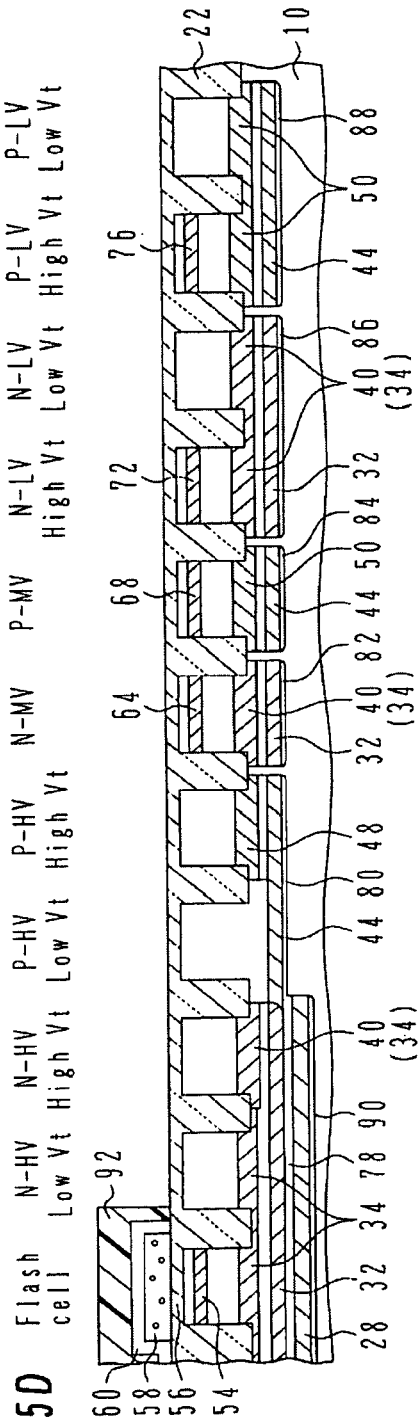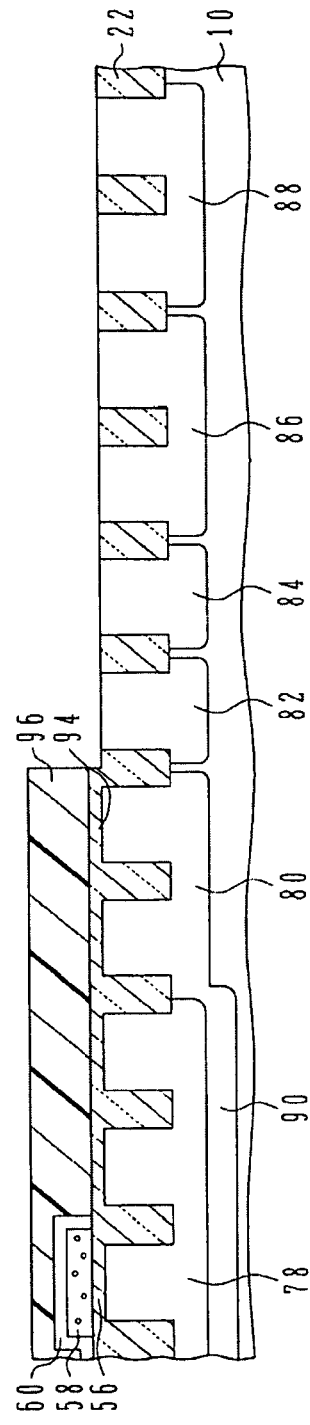
FIG. 5D
FIG. 5E

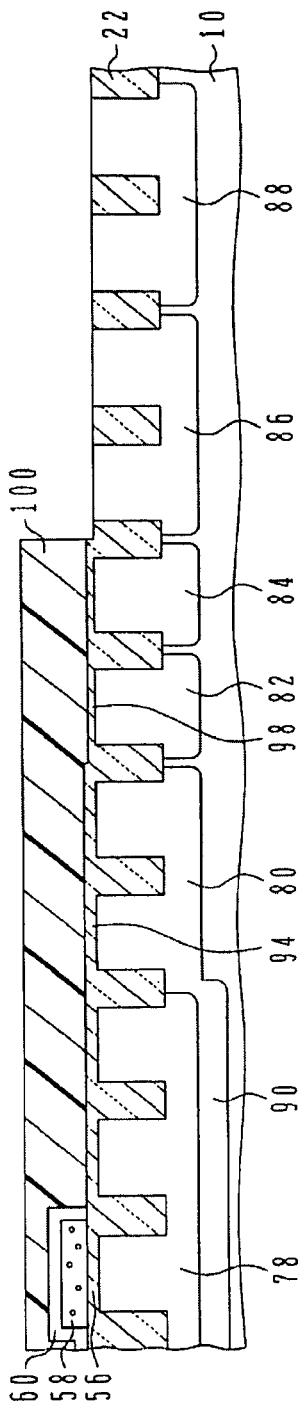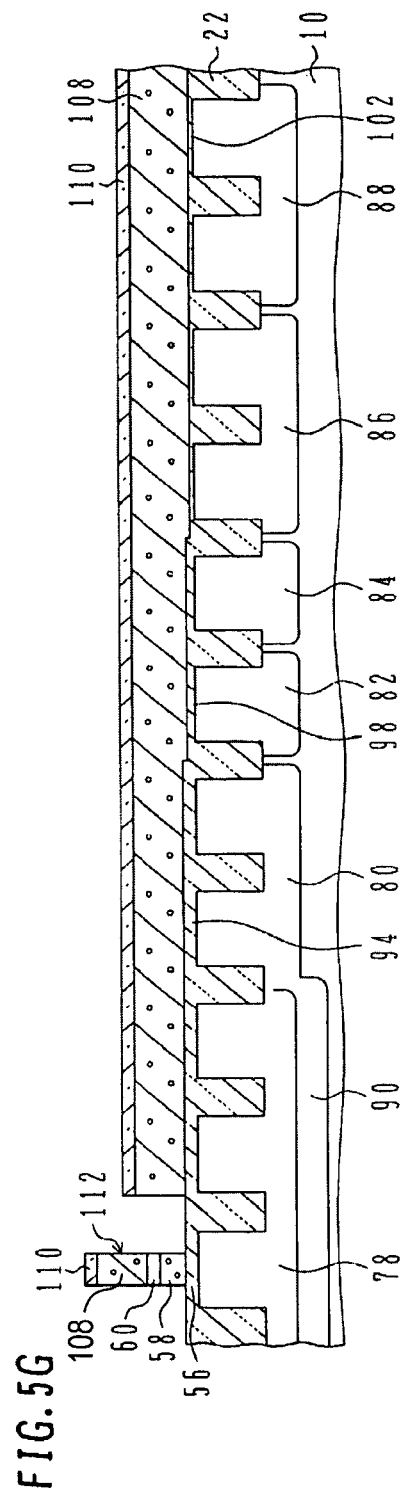

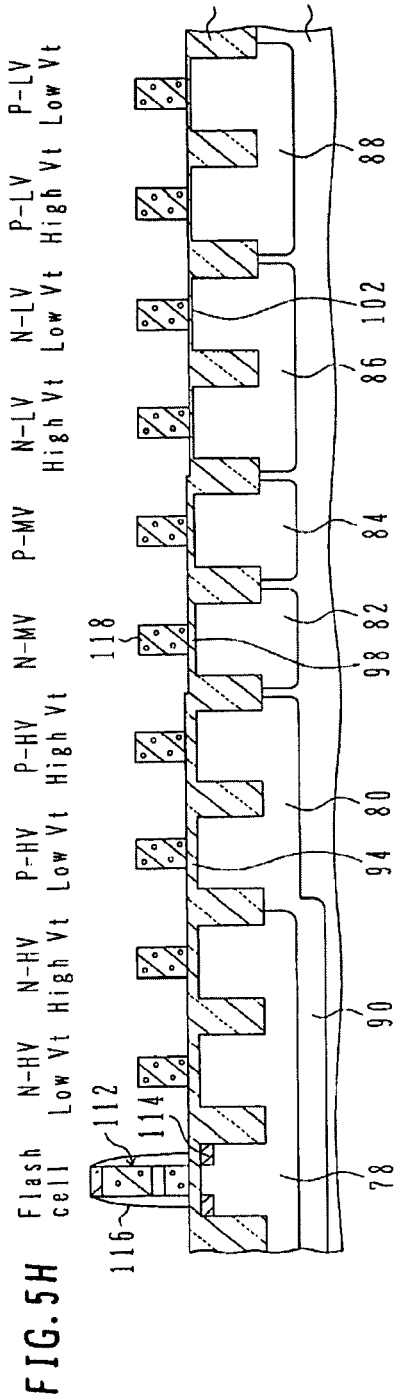
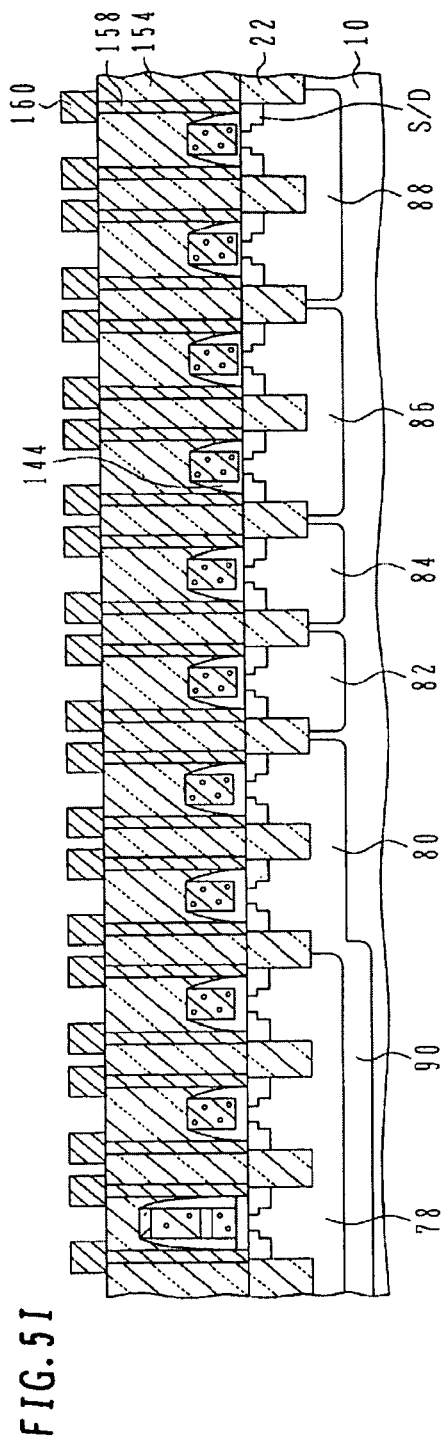
FIG. 5H
FIG. 5I

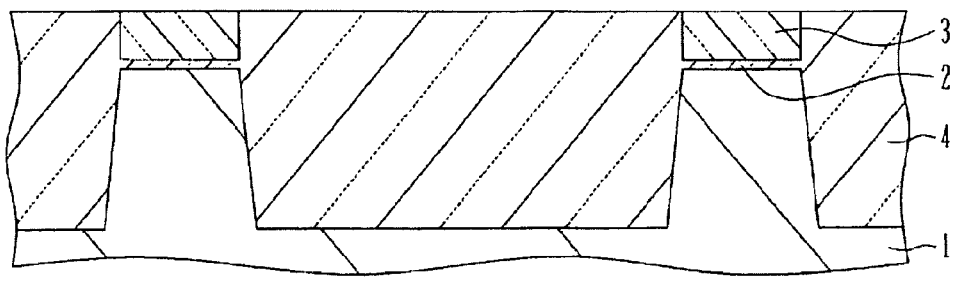
FIG. 6A (CONVENTIONAL)
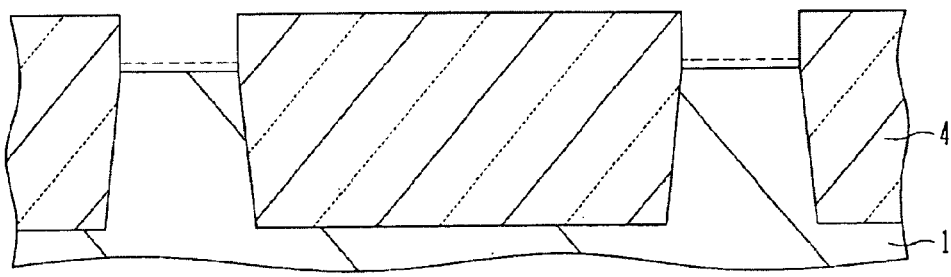
FIG. 6B (CONVENTIONAL)
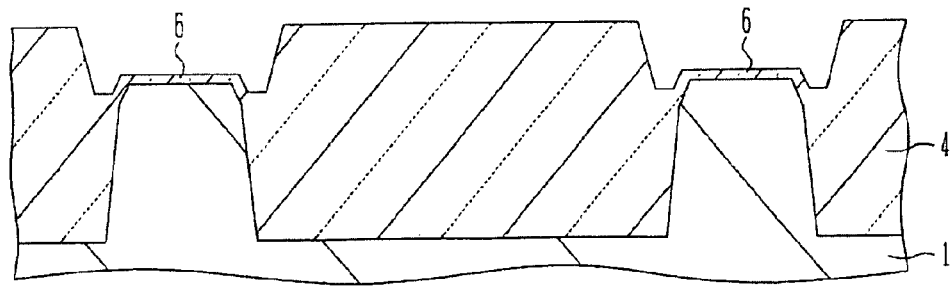
FIG. 6C (CONVENTIONAL)

FIG. 6D (CONVENTIONAL)
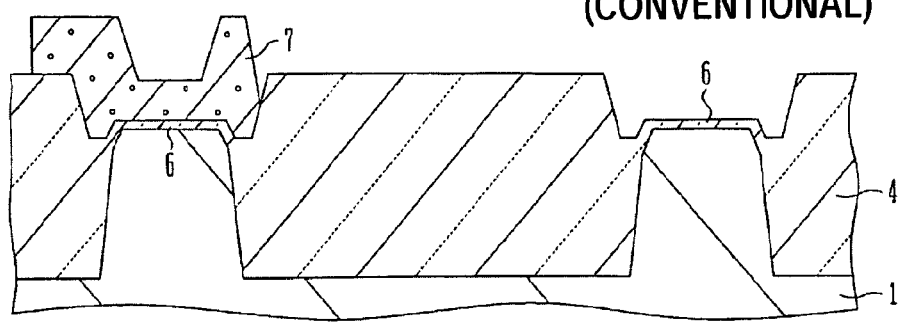
FIG. 6E (CONVENTIONAL)
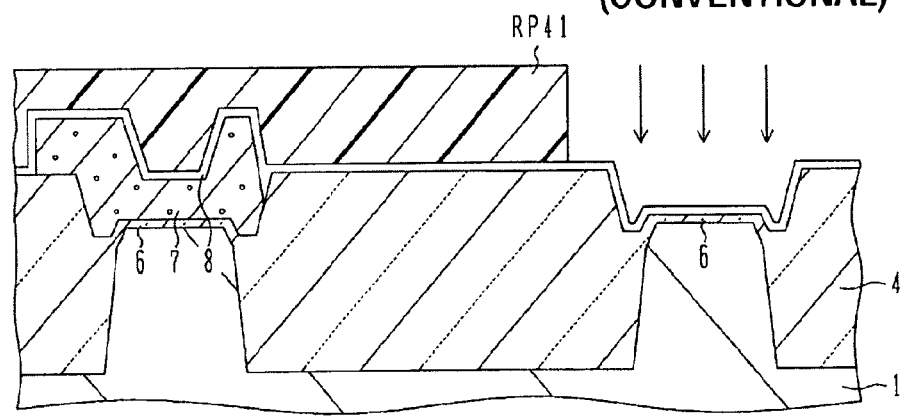
FIG. 6F (CONVENTIONAL)
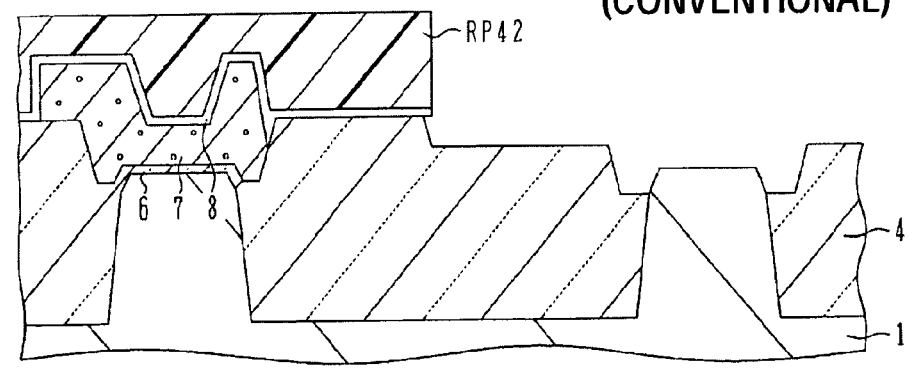

FIG. 6G
(CONVENTIONAL)
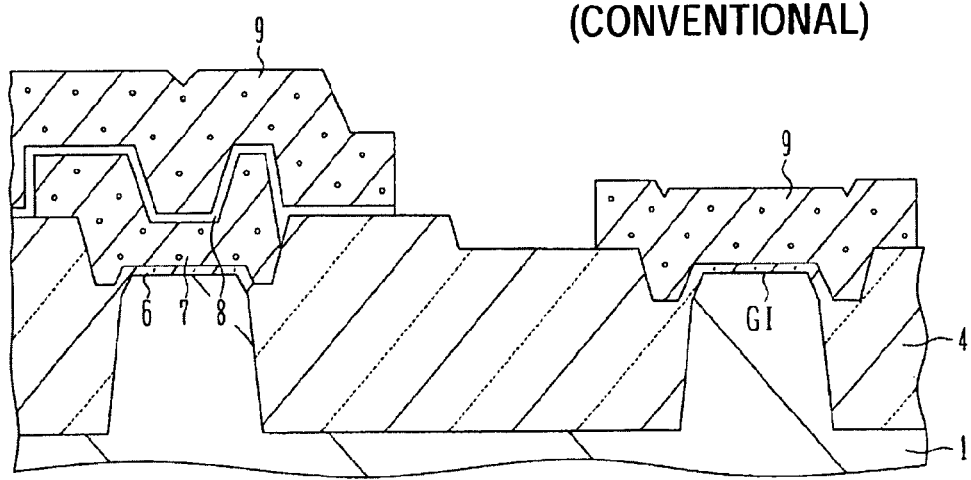
FIG. 6H
(CONVENTIONAL)
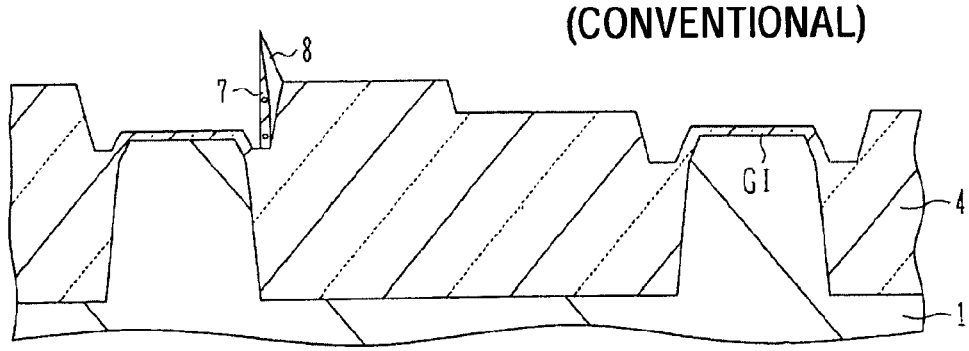

SEMICONDUCTOR DEVICE WITH STI AND METHOD FOR MANUFACTURING THE SEMICONDUCTOR DEVICE

CROSS REFERENCE TO RELATED APPLICATION

This application is a divisional application of U.S. application Ser. No. 13/164,297, filed Jun. 20, 2011, which is a divisional application of U.S. application Ser. No. 12/343,831, filed Dec. 24, 2008, which is a Continuation of International Application No. PCT/JP2006/313083, filed on Jun. 30, 2006, the entire contents of which are incorporated herein by reference.

BACKGROUND

A) Field

The embodiments relate to a semiconductor device with STI and a method for manufacturing the semiconductor device, and more particularly to a semiconductor device with STI having structures of different heights on a plurality of active regions, and a method for manufacturing the semiconductor device of this type. A semiconductor device has typically nonvolatile memory cells with floating gates and MOS transistors of logic circuits.

B) Description of the Related Art

In a semiconductor integrated circuit device (IC), a logic circuit is usually made of a complementary MOS (CMOS) circuit including n-channel MOS (NMOS) transistors and p-channel MOS (PMOS) transistors in order to reduce consumption power. In order to meet the requirements for high integration and high speed of a semiconductor integrated circuit device (IC), transistors as IC constituent elements have been miniaturized. Miniaturization based upon scaling law improves an operation speed of transistors and lowers an operation voltage.

An isolation region made by local oxidation of silicon (LOCOS) produces birds beak portion which gradually reduces its thickness from a target silicon oxide film thickness, narrows an active region area and constitutes wasteful area, hindering improvement of an integration density. In place of LOCOS, STI (shallow trench isolation) has been used widely.

An isolation region by STI is formed in the following manner. A silicon substrate surface is thermally oxidized to form a buffer silicon oxide film, and a silicon nitride film is deposited on the buffer silicon oxide film by chemical vapor deposition (CVD). A resist pattern having an opening pattern corresponding to the isolation region is formed, and the silicon nitride film and silicon oxide film are etched. By using the patterned silicon nitride film as a mask, the silicon substrate is etched to form an isolation trench. The isolation trench defines active regions. After the surface of the isolation trench is thermally oxidized, the isolation trench is filled with a silicon oxide film by high density plasma (HDP) CVD or the like. The silicon oxide film on the silicon nitride film is removed by chemical mechanical polishing (CMP). The silicon nitride film functions as a CMP stopper. The wafer surface after CMP is in a planarized state. The exposed silicon nitride film is etched and removed with hot phosphoric acid, and the buffer silicon oxide film is etched and removed with dilute hydrofluoric acid to expose the surfaces of active regions.

After the formation of STI, the active region surface is thermally oxidized to form an ion implantation sacrificial silicon oxide film, and ion implantation is performed for well formation, channel stop formation and threshold voltage adjustment suitable for respective transistors. After ion implantation, the sacrificial silicon oxide film is etched and removed. The active region surface is again thermally oxidized to form a gate silicon oxide film. In forming gate silicon oxide films having different thicknesses, some gate silicon oxide films are etched and removed, and new gate silicon oxide films are formed. A gate electrode layer of polysilicon or the like is deposited on the gate silicon oxide films and patterned by etching using a resist mask.

The surface of the STI isolation region becomes higher than the active region surfaces. If over-etch is performed when the butter silicon oxide film is etched, the STI silicon oxide film is also etched so that the STI silicon oxide film is retracted near at the peripheries of the exposed active regions, and a concave portion sinking down from the active region surfaces is formed. As the processes of thermal oxidation and the oxide film etching are repeated, the STI silicon oxide film is further retracted, and the concave portion sinking down from the active region surfaces becomes deeper.

If distribution densities of isolation regions of a wafer are different, dishing occurs in a low density area during CMP. In the area with dishing, an amount of STI protrusion from the substrate surface reduces.

Japanese Patent Laid-open Publication No. 2003-297950 describes that as STI is formed in an integrated circuit device including a DRAM memory cell area and a peripheral circuit area, dishing occurs in the peripheral circuit area due to a different pattern density, forming a height difference between silicon oxide films and that a defect density of gate insulating films in the peripheral circuit area is minimum at an STI height relative to the silicon substrate surface is 20 nm, and a defect density of gate insulating films in the memory cell area is minimum at an STI height of 0 nm. It proposes that after CMP of the STI silicon oxide film, the peripheral circuit area is covered with a mask, and STI in the memory cell area is etched to lower STI in the memory cell area, for example, by 20 nm than the STI height in the peripheral circuit area. With this selective etching, protrusion amount of STI from the active area surface realizes the above-described best STI heights, i.e., about 20 nm in the peripheral circuit area and about 0 nm in the memory cell area.

Japanese Patent Laid-open Publication No. 2006-32700 describes that if there is an STI protrusion difference relative to a silicon substrate surface between a DRAM memory cell area and a peripheral circuit area, a margin of photolithography becomes small. It proposes, after STI is formed, to etch STI in the memory cell area in ion implantation process for each active region by using a mask for ion implantation in the memory cell area, to average the STI protrusion in the whole wafer area. As STI in the memory area is selectively etched by an amount corresponding to a dishing amount in the peripheral circuit area, the STI protrusion can be made uniform. Although the protrusion amount is reduced by etching STI in the memory cell area, similar to Japanese Patent Laid-open Publication No. 2003-297950, the object, etching timing and etching amount are different.

These proposals pertain to adjustment of an STI protrusion amount when DRAM memory cells are integrated with the peripheral circuit area.

Logic semiconductor devices embedded nonvolatile semiconductor memories constitute product fields such as a complex programmable logic array (CPLD) and a field programmable gate array (FPGA), and form a large market because of the feature of "programmable". A typical example of a rewritable nonvolatile semiconductor memory is a flash memory having a gate electrode structure including a lamination of a tunneling insulating film, a floating gate electrode, an intergate insulating film and a control gate, substituting an insulated gate electrode structure made of a gate insulating film and a gate electrode on the gate insulating film of an NMOS transistor. An operation voltage of a flash memory is high because charges in the floating gate electrode are written/erased and the channel is controlled via the floating gate electrode by a voltage at the control electrode.

In a logic semiconductor device embedded nonvolatile memory, in addition to flash memory cells, high voltage transistors for flash memory control and low voltage transistors for a high performance logic circuit are integrated on the same semiconductor chip. In order to form a transistor having a low threshold voltage and a transistor having a high threshold voltage, it is necessary to change the conditions of threshold voltage adjustment ion implantation. As ion implantation is performed independently for an NMOS area and a PMOS area, four masks and eight ion implantation processes are required for transistors of four types including a high voltage operation CMOS and a low voltage operation CMOS.

International Publication WO2004/093192, which is incorporated herein by reference, discloses a process of forming transistors of eleven types including in addition to a flash memory, NMOS transistors and PMOS transistors operating at a high voltage and a low voltage and having a high threshold voltage and a low threshold voltage and an NMOS transistor and a PMOS transistor operating at a middle voltage for externally input signals. It proposes an ion implantation method for NMOS (or PMOS) transistors of three types which method uses three masks and four ion implantation processes.

In transistor areas at different operation voltages, a plurality of types of gate insulating films having difference thicknesses are formed. In order to form a thick gate insulating film and a thin gate insulating film, for example, thick gate silicon oxide films are formed first in the whole active region surfaces, and thick gate silicon oxide films are selectively removed from the area where thin gate silicon oxide films are to be formed. Thereafter, thin gate silicon oxide films are formed. In order to form gate silicon oxide films having three different thicknesses, a process of etching a gate silicon oxide film and a succeeding process of forming a gate silicon oxide film are required to be executed twice. In etching the silicon oxide film, an over-etch is performed and the silicon oxide film in the isolation area near the active region is also etched. As the silicon oxide film is etched repetitively, the isolation region has a concave portion not negligible at the boundary of the active region.

The gate electrode of a flash memory has a structure that a control gate is laminated above a floating gate via an ONO film (silicon oxide film/silicon nitride film/silicon oxide film). The floating gate is a gate electrode which takes an electrically floating state, usually made of polysilicon, and patterned by two etching processes. It is not always easy to etch the polysilicon layer whose surface is covered with the ONO film. This difficulty increases if the peripheral area of the active region is surrounded by STI having a concave portion or a protrusion portion and etching is performed at a sloped surface. Since the control gate of a flash memory is formed above the floating gate, the surface of the control gate becomes higher than the surface of the gate electrode of a MOS transistor of a peripheral circuit.

A semiconductor device integrating a flash memory area and a logic circuit area may have a problem different from the problem of a semiconductor device integrating a DRAM memory cell area and a logic circuit area.

PATENT DOCUMENTS

1) Japanese Patent Laid-open Publication No. 2003-297950
2) Japanese Patent Laid-open Publication No. 2006-032700
3) International Publication no. WO 2004/093192

SUMMARY

New solving techniques are sought for new problems.

An object of the embodiment is to provide a semiconductor device and a semiconductor device manufacture method capable of solving new problems.

Another object of the embodiment is to provide a semiconductor device and a semiconductor device manufacture method providing high yield.

Still another object of the embodiment is to provide a semiconductor device and a semiconductor device manufacture method providing a large margin of a photolithography process.

Still another object of the embodiment is to provide a semiconductor device and a semiconductor device manufacture method capable of preventing a problem to be caused by residue of semiconductor material.

According to one aspect of the embodiment, there is provided a semiconductor device comprising:

a semiconductor substrate having first and second areas;

an STI isolation region being made of an isolation trench formed in the semiconductor substrate and an insulating film burying the isolation trench and defining a plurality of active regions in the first and second areas;

a first structure formed on an area from the active region in the first area to a nearby STI isolation region and having a first height; and a second structure formed on an area from the active region in the second area to a nearby STI isolation region and having a second height, wherein a surface of the STI isolation region in the first area is lower than a surface of the STI isolation region in the second area.

According to another aspect of the embodiment, there is provided a method for manufacturing a semiconductor device comprising steps of:

(a) forming a mask insulating film pattern on a semiconductor substrate having first and second areas, the mask insulating film pattern having an opening of an isolation region shape for defining a plurality of active regions;

(b) by using the mask insulating film pattern as an etching mask, etching the semiconductor substrate to form an isolation trench for defining the plurality of active regions;

(c) depositing an isolation material film burying the isolation trench;

(d) subjecting the isolation material film to chemical mechanical polishing to form an isolation region and expose the mask insulating film pattern;

(e) after the step (d), forming a resist pattern covering the second area, etching the isolation region in the first area to remove a partial thickness of the isolation region in the active regions (f) after the step (e), removing the mask insulating film pattern;

(g) after the step (f), forming a first structure having a first height and extending on an area from the active region in the first area to a nearby STI isolation region; and (h) after the step (f), forming a second structure having a second height lower than the first height and extending on an area from the active region in the second area to a nearby STI isolation region.

New problems can be solved.

Patterning on a non-flat surface can be suppressed.

Residue caused by etching can be suppressed.

A height difference can be reduced and a margin of a photolithography process can be increased.

BRIEF DESCRIPTION OF THE DRAWINGS

FIGS. 5A to 5J are cross sectional views illustrating manufacture processes for the semiconductor device shown in FIG. 4.

FIGS. 6A to 6H are cross sectional views illustrating new problems of a semiconductor integrated circuit device mixedly integrating a flash memory and a logic circuit.

DESCRIPTION OF THE PREFERRED EMBODIMENTS

Figure 1A:
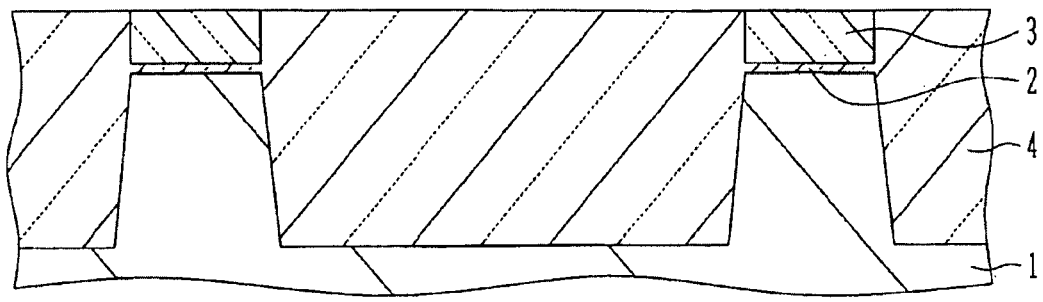
FIGS. 1A to 1I, and 1K are cross sectional views illustrating manufacture processes for a semiconductor device according to a first embodiment.

First, with reference to FIGS. 6A to 6G, description will be made on a method for manufacturing an integrated circuit including a flash memory and a logic circuit according to conventional art.

As shown in FIG. 6A, the surface of a silicon substrate 1 is thermally oxidized to form a buffer silicon oxide film 2, and a silicon nitride film 3 is formed on the buffer silicon oxide film by chemical vapor deposition (CVD). By using a resist pattern, the silicon nitride film 3 and silicon oxide film 2 are patterned to leave the silicon nitride film 3 and silicon oxide film 2 having a shape covering active regions. By using the silicon nitride film 3 as a mask, the silicon substrate 1 is etched to form an isolation trench. After the surface of the isolation trench is oxidized, the trench is filled with a silicon oxide film 3 by high density plasma (HDP) CVD. Chemical mechanical polishing (CMP) is performed starting from the surface of the silicon oxide film 4 to remove the silicon oxide film 4 above the surface level of the silicon nitride film 3.

As shown in FIG. 6B, the silicon nitride film is etched and removed with hot phosphoric acid. The exposed buffer silicon oxide film 2 is etched and removed with dilute hydrofluoric acid. The STI silicon oxide film 4 is also slightly etched in this case. A structure is therefore obtained in which the protruding STI surrounds an active region. Thereafter, the active region surface is thermally oxidized to form a sacrificial silicon oxide film for ion implantation, and ion implantation is performed for well formation, channel stop formation and threshold voltage adjustment in a manner suitable for each active region. After ion implantation, the sacrificial silicon oxide film is removed. A step portion (a portion having a non-flat surface) of STI near the active region expands outside the active region border.

As shown in FIG. 6C, the active region surface is thermally oxidized to form a tunneling silicon oxide film 6 for a flash memory cell. FIG. 6C also shows a concave portion formed in STI near the active region by repetitively performing silicon oxide film etching.

As shown in FIG. 6D, a polysilicon film 7 is deposited by CVD, covering the tunneling silicon oxide film 6, and etched by using a resist pattern to perform patterning along a gate width direction (lateral direction in the drawing). It is not easy to etch the polysilicon film 7 vertically and perfectly in the step portion formed in the STI peripheral area.

As shown in FIG. 6E, an ONO film 8 is formed covering the polysilicon film 7. For example, a silicon oxide film and a silicon nitride film are deposited by CVD on the whole wafer surface, covering the polysilicon film 7, and the surface of the silicon nitride film is thermally oxidized to form a silicon oxide film. A resist pattern RP41 having an opening on a desired active region is formed, and ion implantation is performed for threshold voltage control in a logic circuit area. The resist pattern RP41 is thereafter removed.

As shown in FIG. 6F, is formed a resist pattern RP42 having an opening in an area where the ONO film 8 is to be removed, and the exposed ONO film 8 is etched and removed. The tunneling silicon oxide film 6 exposed in the active region is further etched and removed. With this etching process, STI in an area other than the flash memory area is etched and its surface is lowered. The resist pattern RP42 is thereafter removed.

As shown in FIG. 6G, a polysilicon film 9 for a gate electrode is deposited by CVD. A control gate is patterned by etching using a resist pattern having a control gate shape in the flash memory area, and further the ONO film 8 and floating gate 7 are also patterned. Ion implantation is performed to form source/drain regions of a flash memory. A gate electrode of a logic circuit is patterned by using a resist pattern covering the flash memory area and having a gate electrode shape in the peripheral circuit area. Ion implantation into the logic circuit is performed to form source/drain regions.

Figure 1B:
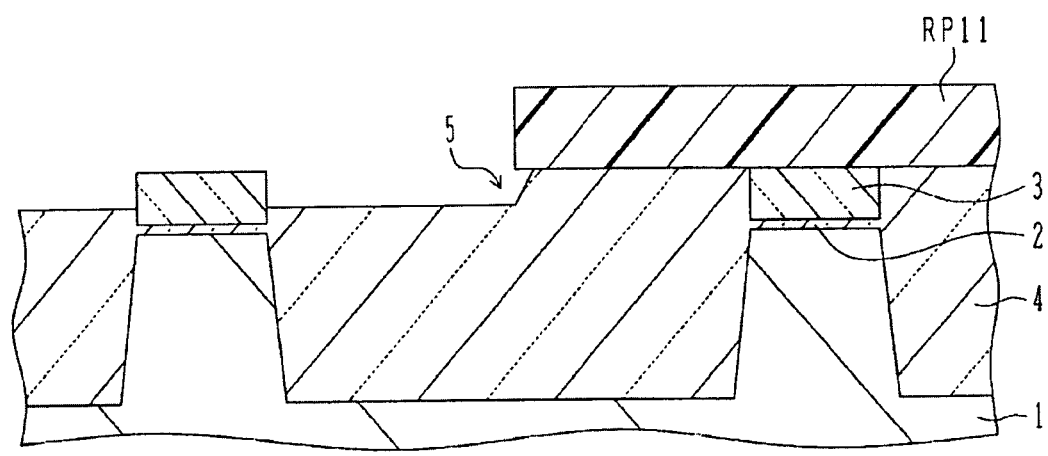
Figure 1C:
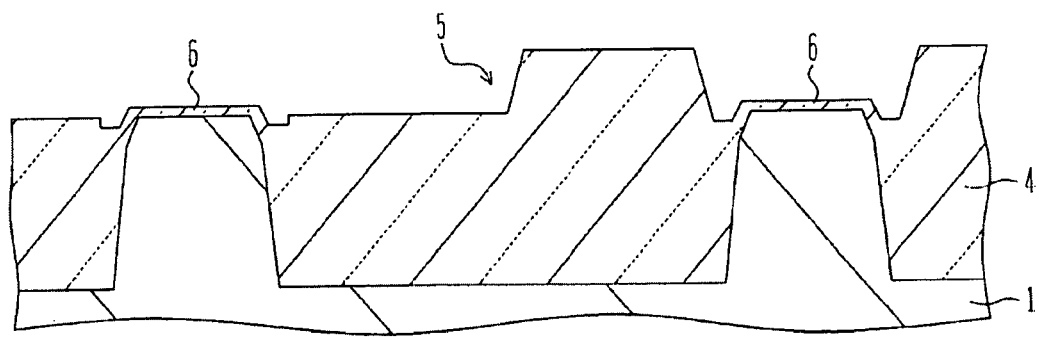
Figure 1D:
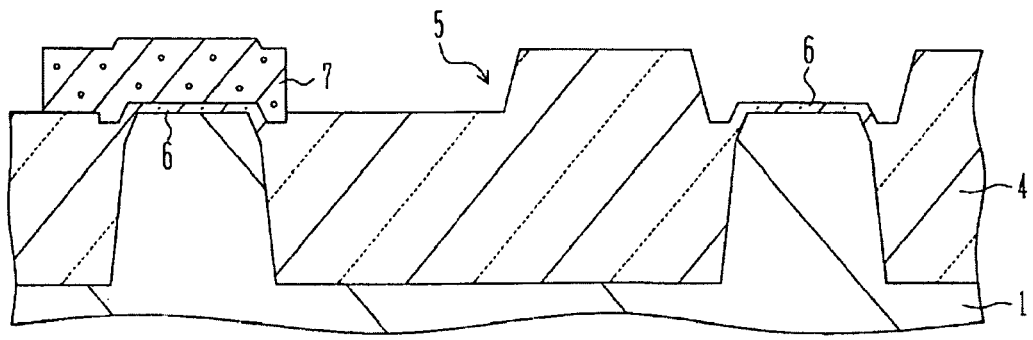
Figure 1E:
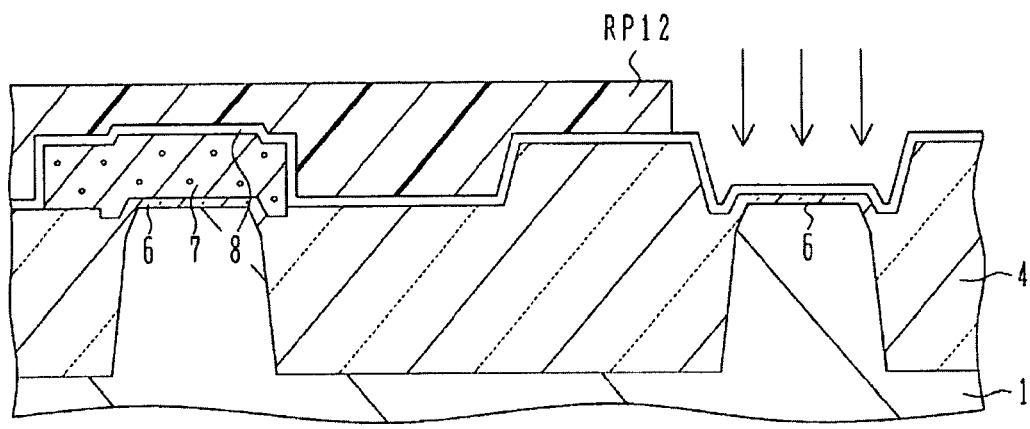
Figure 1F:
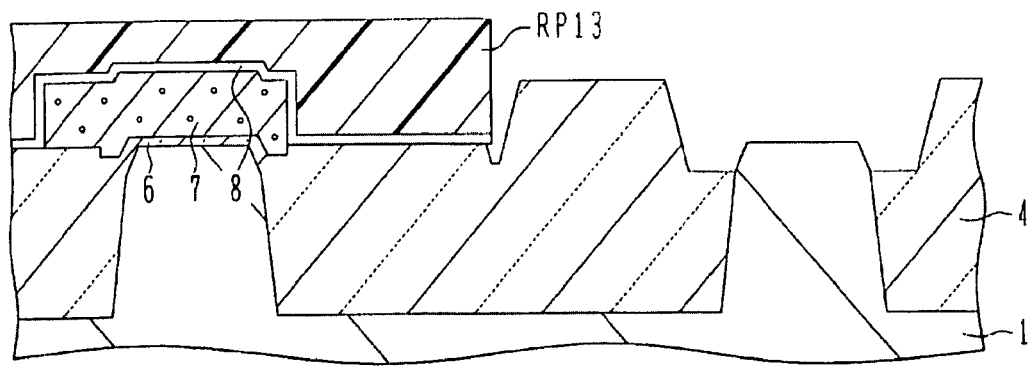
Figure 1G:
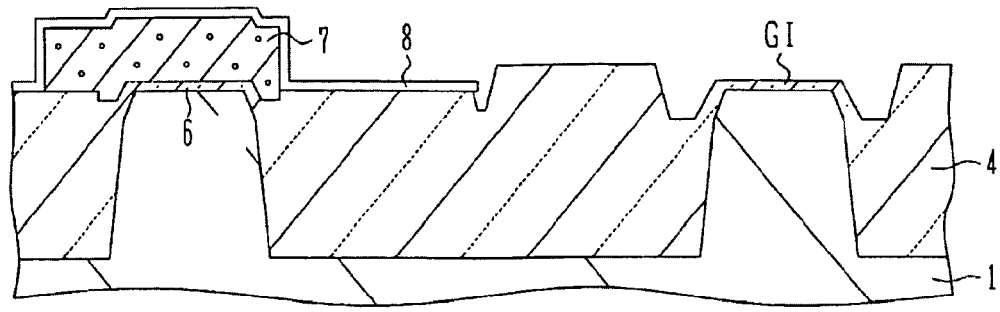
Figure 1H:
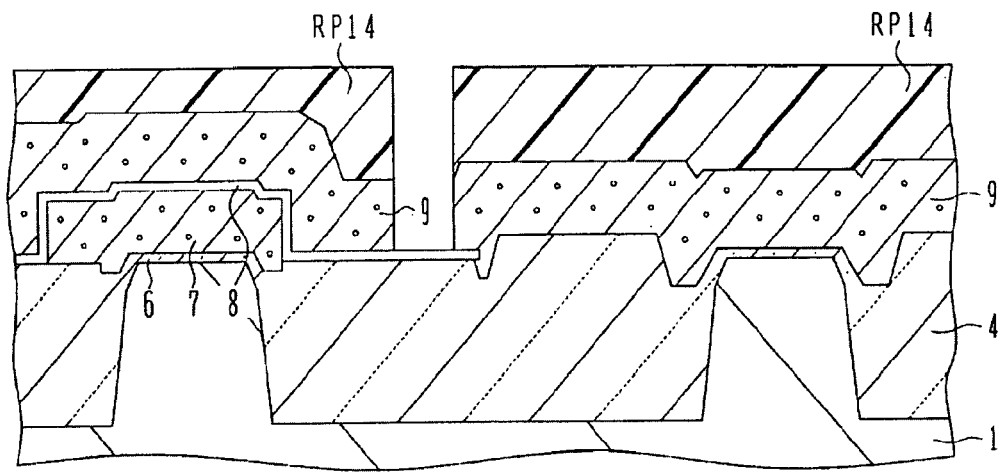
Figure 1I:
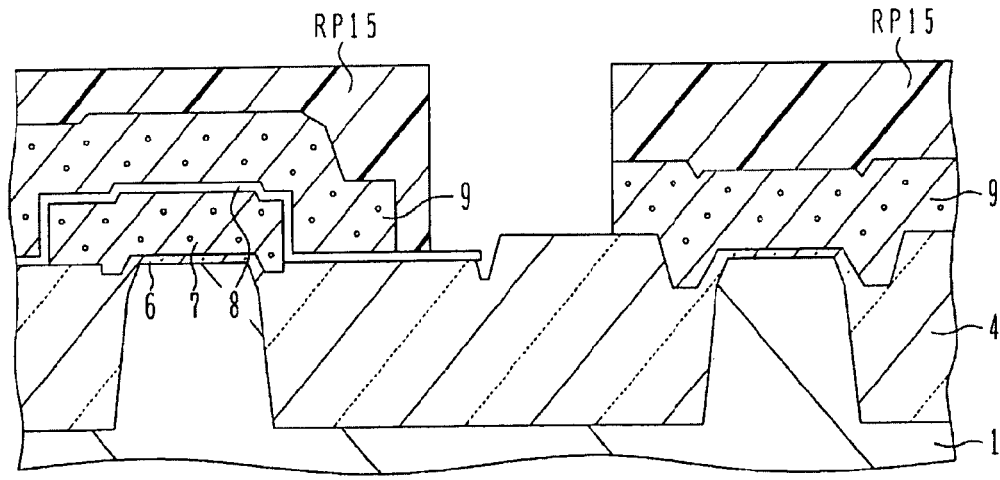
Figure 1J:
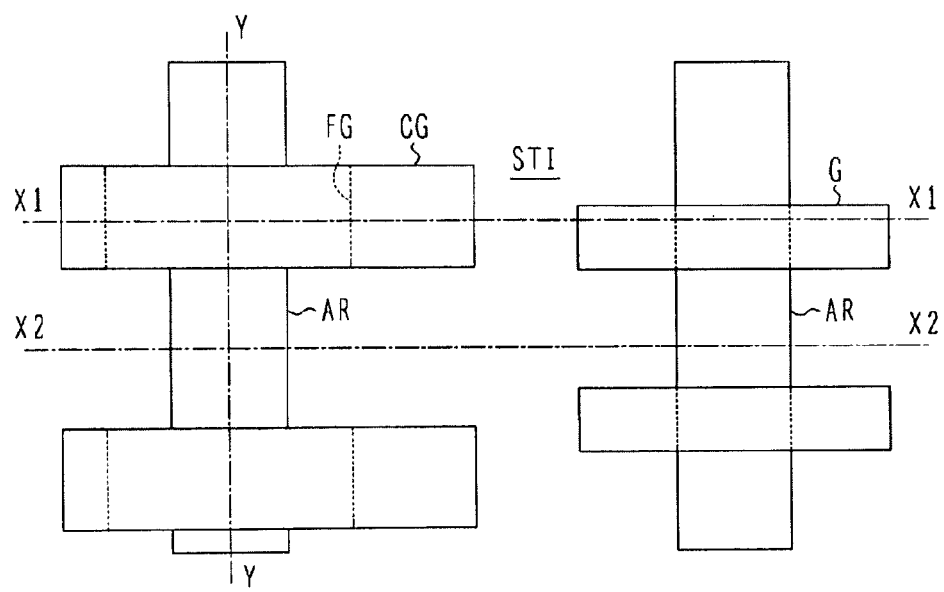
FIG. 1J is a cross sectional view showing a layout of gate electrodes.

FIG. 1J is a plan view schematically showing the shapes of gate electrodes of a flash memory and a MOS transistor in the peripheral circuit. In the flash memory shown left, a floating gate FG is disposed under a control gate CG, and the upper and lower sides as viewed in the drawing of the floating gate FG are patterned in conformity with the upper and lower sides of the control gate CG. Before etching, although the gate width direction of the floating gate FG has been already patterned, a laminated state of the floating gate FG, ONO film and control gate layer is maintained in areas between the stripe regions which will become the control gate CG. If the floating gate is not separated perfectly by etching, a short circuit is formed. However, the ONO film on the side wall of the floating gate becomes apparently thick in the vertical direction so that it is not easy to perfectly etch and remove the ONO film.

FIG. 6H shows a state that the ONO film 8 was not removed perfectly but was left like a wall, and the polysilicon film of the floating gate was left on the ONO wall. If the polysilicon film 7 shorts an adjacent floating gate, a defective memory is formed. Even if only the ONO film 8 is left, a thin wall-like ONO film may become a dust source.

The control gate of the flash memory cell rides on the floating gate, and becomes highest on STI which has a higher level surface than the active region. On the other hand, the STI surface in the area other than the flash memory area was etched by the etching process for the ONO film and tunneling silicon oxide film shown in FIG. 6F and became lower, and moreover since the floating gate does not exist under the gate electrode, the lowest surface of the gate electrode layer is greatly lower than the highest surface in the flash memory area. Namely, the flash memory area is as a whole higher than the logic area, and the flash memory area forms an area like a plateau as viewed from the whole semiconductor chip. As insulating films are formed on the substrate having such different height, and contact holes, metal wirings and the like are formed to form a multi-layer wiring structure, substantial focal depth in the process of forming multi-layer wiring becomes shallow corresponding in amount to the height difference.

Figure 1K:
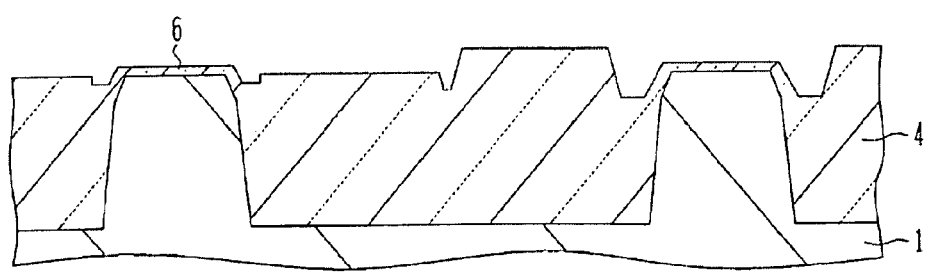

With reference to FIGS. 1A to 1K, description will be made on a method for manufacturing the semiconductor device according to the first embodiment. FIGS. 1A to 1I are cross sectional views illustrating main manufacture processes, FIG. 1J is a plan view showing the shapes of gate electrodes, and FIG. 1K is a cross sectional view of an area between control gates.

As shown in FIG. 1A, the surface of a silicon substrate 1 is thermally oxidized to form a buffer silicon oxide film 2 having a thickness of, e.g., 10 nm, and a silicon nitride film 3 having a thickness of, e.g., 110 nm is deposited on the silicon oxide film by CVD. By using a resist pattern, the silicon nitride film 3 and silicon oxide film 2 are patterned to leave a mask insulating film pattern made of a lamination of the buffer silicon oxide film 2 and silicon nitride film 3 and having a shape covering the active region. By using the silicon nitride film 3 as an etching mask, the silicon substrate is etched to a depth of, e.g., 300 nm to form an isolation trench. A silicon oxide film 4 is deposited to a thickness of, e.g., 550 nm by HDPCVD to bury the isolation trench. CMP is performed starting from the surface of the silicon oxide film to remove the silicon oxide film 4 above the surface level of the silicon nitride film 3.

As shown in FIG. 1B, a resist pattern RP11 for exposing the flash memory area is formed, and the HDPCVD silicon oxide film 4 is etched to an intermediate depth of the silicon nitride film 3 on the active region surface, e.g., to a depth of 40 nm. In the flash memory area, although the silicon nitride film 3 protrudes above the silicon oxide film 4, the recessed surface of the etched silicon oxide film 4 is flat. The active region maintains a state being covered with the insulating film. The STI surface forms a step 5 at an intermediate position from the flash memory area to the logic circuit area, and becomes high starting from the intermediate position. The resist pattern RP11 is thereafter removed.

As shown in FIG. 1C, the silicon nitride film 3 is etched and removed with hot phosphoric acid. The exposed buffer silicon oxide film 2 is etched and removed with dilute hydrofluoric acid. STI is also etched at the same time in this case. In the logic circuit area, a structure is obtained in which the protruding STI surrounds the active area. Thereafter, the active region surface is thermally oxidized to form an ion implantation sacrificial silicon oxide film, and ion implantation is performed for well formation, channel stop formation and threshold voltage adjustment in a manner suitable for each active region. After ion implantation, the sacrificial silicon oxide film is removed. The STI silicon oxide film 4 is also etched, and the concave portion around the active region becomes deep. The active region surface is thermally oxidized to form a tunneling silicon oxide film 6 having a thickness of, e.g., about 10 nm for a flash memory cell. In the flash memory area, since the STI surface was lowered by etching in the process shown in FIG. 1B, the STI surface is further lowered by etching of the silicon oxide film. Height difference around the active region is small, excepting a concave portion around the active region.

As shown in FIG. 1D, a polysilicon film 7 is deposited by CVD to a thickness of, e.g., 90 nm, covering the tunneling silicon oxide film 6, and etched by using a resist pattern to perform patterning along a gate width direction (lateral direction in the drawing). Since the STI surface in the flash memory area was lowered and height difference is small, it is easy to etch the polysilicon film 7 vertically and perfectly.

As shown in FIG. 1E, an ONO film 8 is formed covering the polysilicon film 7. For example, a silicon oxide film having a thickness of e.g., about 5 nm and a silicon nitride film having a thickness of, e.g., about 10 nm are deposited by CVD on the whole wafer surface, covering the polysilicon film 7, and the surface of the silicon nitride film is thermally oxidized to form a silicon oxide film having a thickness of about 5 nm. A total thickness of the ONO film 8 is about 15 nm. A resist pattern RP12 having an opening on a desired active region is formed, and ion implantation is performed for threshold voltage control of a logic circuit area. The resist pattern RP12 is thereafter removed.

As shown in FIG. 1F, a resist pattern RP13 having an opening in an area where the ONO film 8 is removed, is formed, and the exposed ONO film 8 is etched and removed. The exposed tunneling silicon oxide film 6 is also etched and removed. With this etching process, STI in an area other than the flash memory area is also etched and its surface is lowered slightly. The STI surface in the logic area is higher than the STI surface in the flash memory area. The resist pattern RP13 is thereafter removed.

As shown in FIG. 1G, a gate insulating film GI of silicon oxide is formed on the active region surface in the logic area by thermal oxidation. If gate insulating films of three thickness types are to be formed, thermal oxidation and selective silicon oxide etching are repeated twice, and thermal oxidation is further performed to sequentially form thinner silicon oxide films from the thick silicon oxide film. Although the STI surface in the logic area is lowered, this surface can be made higher than the STI surface in the flash memory area. Even the STI surface becomes lower than that in the flash memory area, a height difference is smaller than a conventional height difference. The concave portion around the active region becomes deep.

As shown in FIG. 1H, a polysilicon film 9 for a gate electrode is deposited by CVD. By using a resist pattern RP14 covering the logic area and having a control gate shape in the flash memory area, the polysilicon film 9 is etched, and further the ONO film 8 and floating gate 7 are etched. In this manner, the gate electrode of the flash memory is patterned. At this stage, the logic circuit area is covered with the resist pattern RP14 and is not etched. Ion implantation is performed to form source/drain regions of a flash memory. The resist pattern RP14 is thereafter removed. Processes such as oxidation of gate electrode side walls and the like are performed to form a flash memory structure.

As shown in FIG. 1I, a resist pattern RP15 is newly formed which covers the flash memory area and has a gate electrode shape in the logic circuit area, and the polysilicon film 9 is etched to pattern a gate electrode in the logic circuit area. Thereafter, ion implantation is performed for the logic circuit to form source/drain regions. The resist pattern RP15 is thereafter removed.

FIG. 1J is a plan view schematically showing the layout of gate electrodes of a flash memory and a MOS transistor. An elongated active region AR is disposed in the vertical direction in the drawing. In the logic circuit, a gate electrode G of a MOS transistor traverses the active region AR and extends on the STI isolation region. In the flash memory, a floating gate FG and a control gate CF traverse the active region and extend on the STI isolation region. In the area between adjacent control gates, the floating gate FG and control gate CG are etched perfectly and residue does not exist. Residue of the ONO film 8 and polysilicon film 7 shown in FIG. 6H is not desirous. Since height difference of the active region and peripheral region is small in the flash memory area, etching without leaving residue becomes easy.

FIG. 1K is a cross sectional view showing a region between control gates CG along line X2-X2 of FIG. 1J. Since height difference on the underlying surface is small, it becomes easy to perfectly etch the control gate and floating gate. FIGS. 1A to 1I are cross sectional views along line X1-X1.

Thereafter, processes are performed including electrode formation, insulating film formation, multi-layer wiring formation and the like. The STI surface in the flash memory area is lowered and the level of the gate electrode surface in the logic area is in a distribution range of gate electrode surface levels in the flash memory area. In addition, since a height difference between the flash memory area and logic area is reduced more than conventional art, a problem of a focal depth of photolithography is alleviated in the processes shown in FIGS. 1H and 1I.

As a process of lowering the STI surface in the flash memory area is executed, a step is formed between the flash memory area and logic area. This step may cause some problems of film formation and removal in the step area. With reference to FIGS. 2A to 2F, a method for manufacturing a semiconductor device of the second embodiment will be described mainly on different points from the first embodiment.

Figure 2A:
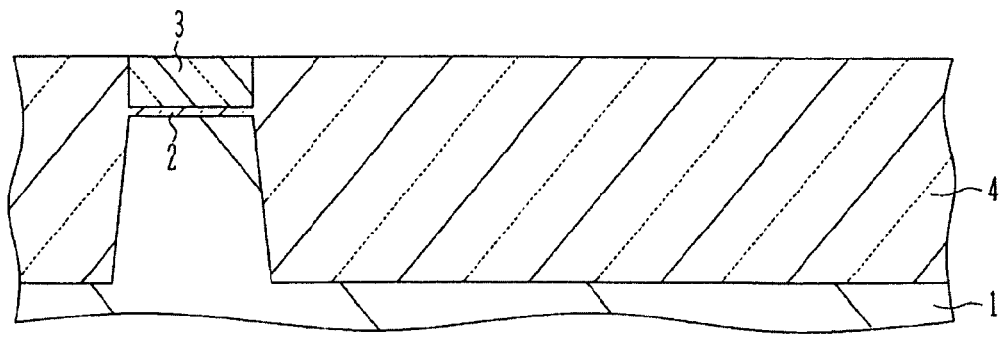
FIGS. 2A to 2F are cross sectional views illustrating manufacture processes for a semiconductor device according to a second embodiment.

FIG. 2A is similar to FIG. 1A. The surface of a silicon substrate 1 is thermally oxidized to form a buffer silicon oxide film 2, and a silicon nitride film 3 is deposited on the silicon oxide film by CVD. By using a resist pattern, the silicon nitride film 3 and silicon oxide film 2 are patterned, and by using the silicon nitride film 3 as an etching mask, the silicon substrate is etched to form an isolation trench. A silicon oxide film 4 is deposited by HDPCVD to bury the isolation trench. CMP is performed starting from the surface of the silicon oxide film 4 by using the silicon nitride film 3 as a stopper to remove the silicon oxide film 4 above the surface level of the silicon nitride film 3.

Figure 2B:
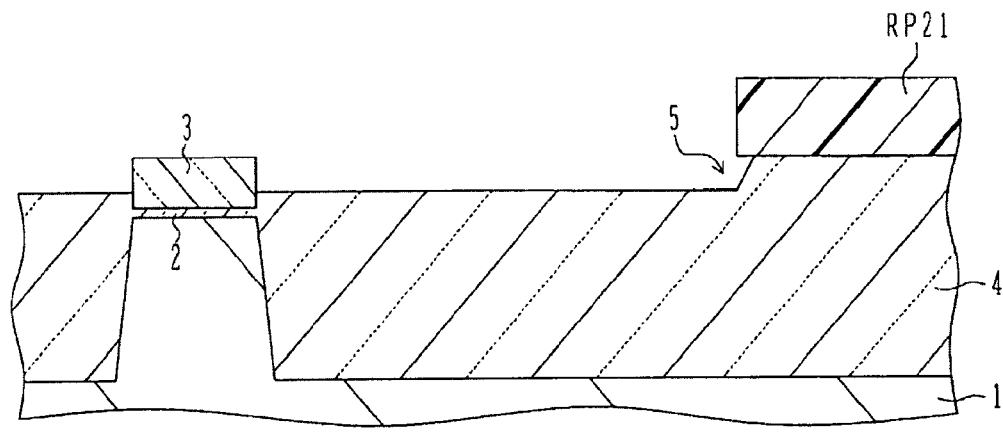

As shown in FIG. 2B, a resist pattern RP21 for exposing the flash memory area with some peripheral margin space is formed, and the HDPCVD silicon oxide film 4 is etched to an intermediate thickness of the nitride film on the active region. The STI surface in the flash memory area is therefore lowered and a step 5 is formed at a position remote from the active region in the flash memory area. The resist pattern RP21 is thereafter removed, and similar to the first embodiment, the silicon nitride film 3 and buffer silicon oxide film 2 are etched and removed. The exposed active region surface is thermally oxidized to form a tunneling silicon oxide film for a flash memory.

Figure 2C:
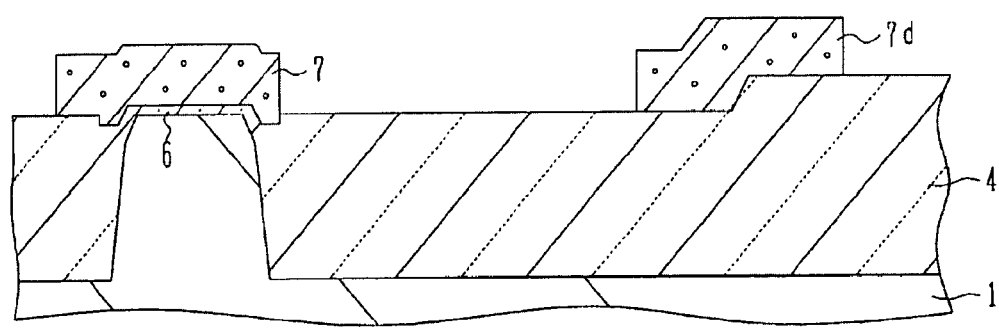

As shown in FIG. 2C, a polysilicon film 7 is deposited covering the tunneling silicon oxide film 6, and etched by using a resist pattern to perform patterning along a gate width direction. In this case, a dummy 7d of the polysilicon film covering the step portion 5 is left. Since the step portion 5 is formed at a position remote from the flash memory area, it is easy to pattern the floating gate and the discrete dummy 7d.

Figure 2D:
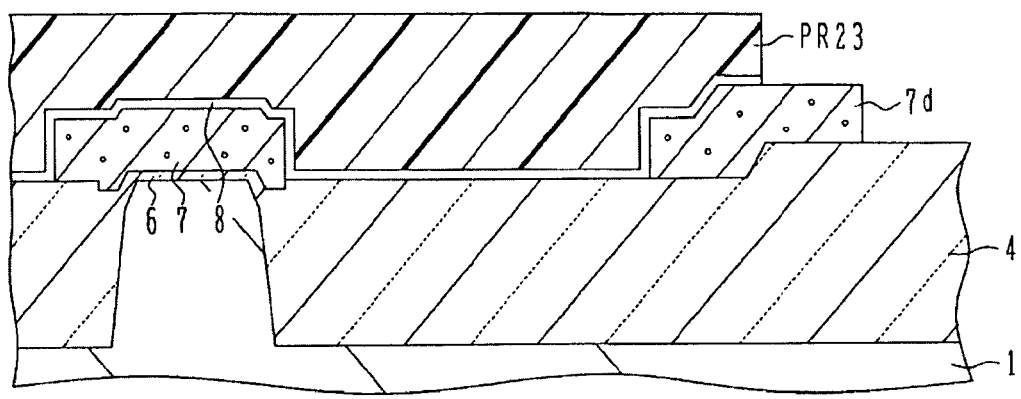

As shown in FIG. 2D, an ONO film 8 is formed covering the polysilicon film 7. A resist pattern RP23 having an opening on a desired active region is formed, and ion implantation is performed for threshold voltage control of a logic circuit area. By using the resist pattern RP23 covering the flash memory area, riding the step of the polysilicon film 7 on the step portion 5 and reaching the flat surface, the exposed ONO film is etched and removed. Further, the exposed tunneling silicon oxide film 6 is etched and removed. Although this process is similar to the etching process shown in FIG. 1F, the ONO film can be etched easily because the etching is performed on the flat surface not including the step formed between the flash memory area and logic circuit area. The resist pattern RP23 is thereafter removed. The surface of the active region in the logic area is thermally oxidized to form a gate insulating film. A polysilicon film for a gate electrode is deposited by CVD.

Figure 2E:
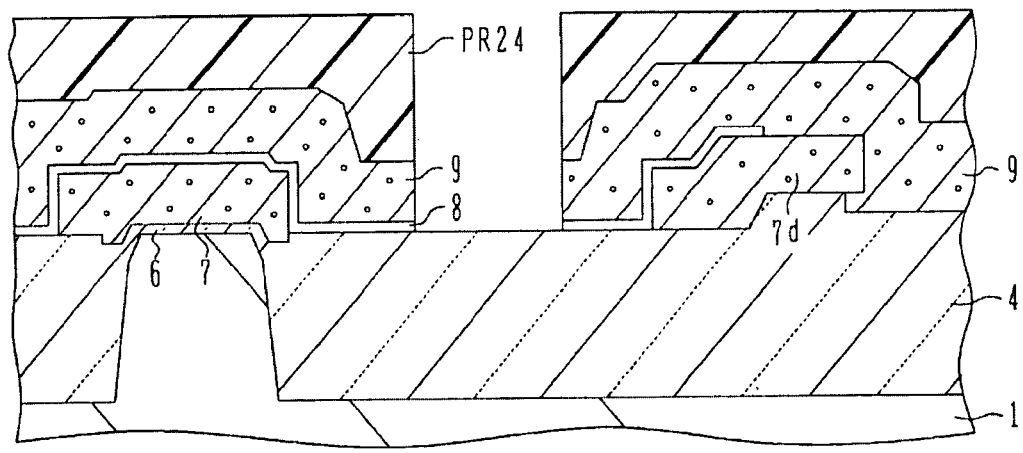

As shown in FIG. 2E, a resist pattern RP24 is formed which has a control gate pattern in the flash memory area and covers the polysilicon layer 7 and ONO film 8 in the step portion. The logic circuit area is covered with the resist pattern RP24. By using the resist pattern RP24 as an etching mask, the control gate is patterned, and further the ONO film 8 and floating gate 7 are patterned. In the step portion, the polysilicon film 9 is patterned in a shape covering the polysilicon layer 7 and ONO film 8. Ion implantation is performed to form source/drain regions of a flash memory. The resist pattern RP24 is thereafter removed.

Figure 2F:
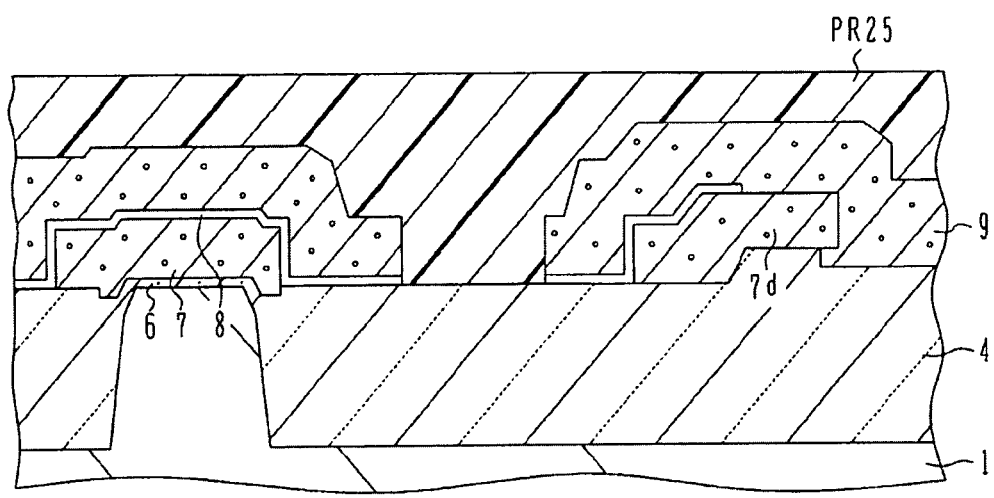

As shown in FIG. 2F, a resist pattern RP25 is newly formed which covers the flash memory area and step portion and has a gate electrode shape in the logic circuit area, the polysilicon film 9 is etched to pattern the gate electrode in the logic circuit area, and thereafter, ion implantation is performed in the logic circuit area to form source/drain regions.

According to the embodiment, in the step portion between the flash memory area and logic area formed by the process of lowering the STI surface in the flash memory area, the floating gate polysilicon film, ONO film and control gate polysilicon film are left positively to maintain the structure that the ONO film is sandwiched between the polysilicon films. It is therefore possible to prevent etching residue and stripping of the ONO film and reduce a possibility of dust formation.

Figure 3A:
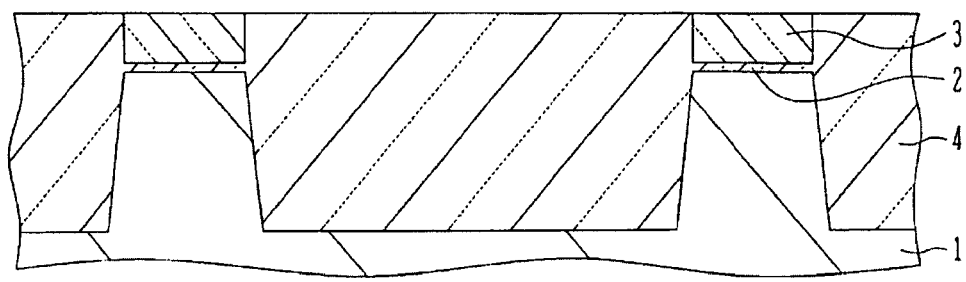
FIGS. 3A and 3B are cross sectional views illustrating manufacture processes for a semiconductor device according to a third embodiment.
Figure 3B:
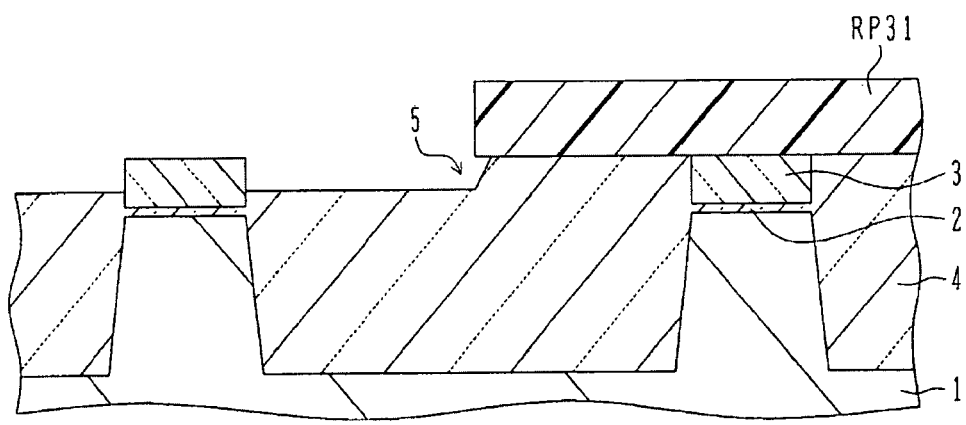

A mask for partial etching of STI in the flash memory area may be used commonly as a mask for another process. With reference to FIGS. 3A and 3B, description will be made on a method for manufacturing a semiconductor device according to the third embodiment.

FIG. 3A is similar to FIG. 1A. The surface of a silicon substrate 1 is thermally oxidized to form a buffer silicon oxide film 2, and a silicon nitride film 3 is deposited on the silicon oxide film by CVD. By using a resist pattern, the silicon nitride film 3 and silicon oxide film 2 are patterned, and by using the silicon nitride film 3 as an etching mask, the silicon substrate is etched to form an isolation trench. A silicon oxide film 4 is deposited by HDPCVD to bury the isolation trench. CMP is performed starting from the surface of the silicon oxide film 4 to remove the silicon oxide film 4 above the surface level of the silicon nitride film 3.

As shown in FIG. 3B, a resist pattern RP31 for exposing the flash memory area is formed. By using the resist pattern RP31 as a mask, threshold voltage control ion implantation is performed for the active region of a flash memory. By using the same resist pattern RP31 as an etching mask, an HDPCVD silicon oxide film 4 is etched to an intermediate thickness of the nitride film on the active region. The resist pattern RP31 is thereafter removed. Other processes are similar to those of the first embodiment. Since the ion implantation mask and etching mask are used in common, an increase in the number of masks can be suppressed.

A specific embodiment will now be described. It is herein assumed that a main logic circuit is constituted of low voltage CMOS transistors operating at 1.2 V, an input/output circuit is constituted of middle voltage CMOS transistors operating at 2.5 V or 3.3 V, and a nonvolatile memory control circuit is constituted of high voltage CMOS transistors operating at 5, 10 V. The low voltage and high voltage transistors each have two types: a high threshold voltage and a low threshold voltage. In addition to a nonvolatile memory, transistors of eleven types in total are used.

Figure 4:
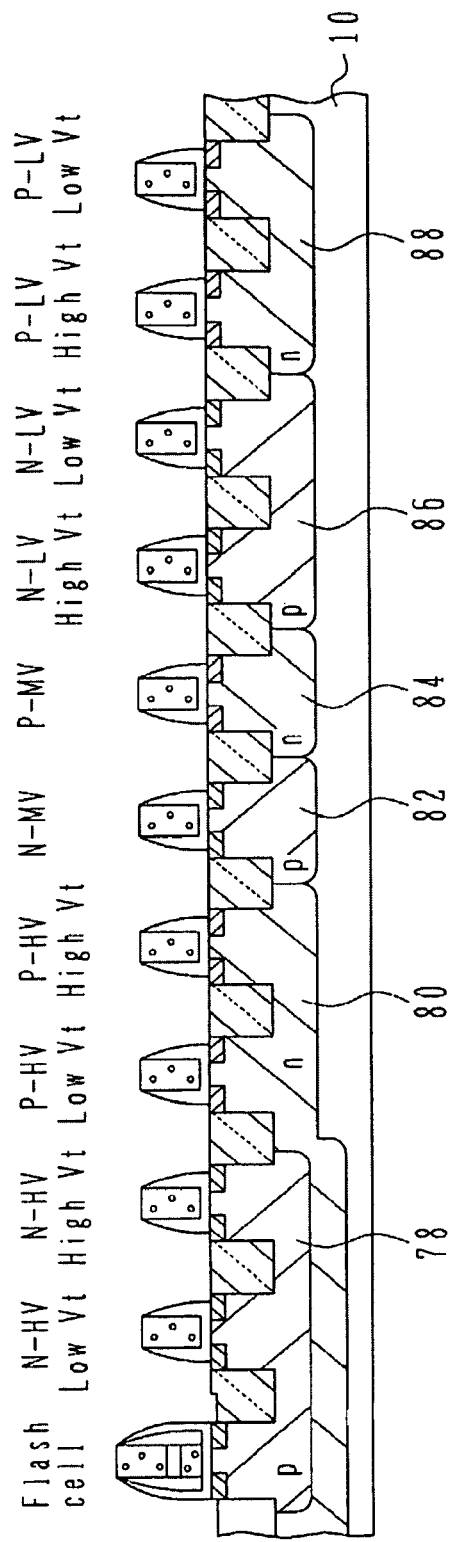
FIG. 4 is a cross sectional view of a semiconductor device having transistors of eleven types according a specific embodiment.

As shown in FIG. 4, formed in a semiconductor substrate 10 are n-type wells 80, 84 and 88 and p-type wells 82 and 86, and further a p-type well 78 in the n-type well 80. Formed in the p-type well 78 are a flash memory cell (Flash cell), an n-channel high voltage/low threshold voltage transistor (N-HV Low Vt) and an n-channel high voltage/high threshold voltage transistor (N-HV High Vt), respectively operating at a high voltage. Formed in the n-type well 80 are a p-channel high voltage/low threshold voltage transistor (P-HV Low Vt) and a p-channel high voltage/high threshold voltage transistor (N-HV High Vt), respectively operating at a high voltage. Formed in the p-type well 82 and n-type well 84 are an n-channel middle voltage transistor (N-MV) and a p-channel middle voltage transistor (P-MV) respectively operating at a middle voltage. Formed in the p-type well 86 are an n-channel low voltage/high threshold voltage transistor (N-LV High Vt) and an n-channel low voltage/low threshold voltage transistor (N-LV Low Vt), respectively operating at a low voltage, and formed in the n-type well 88 are a p-channel low voltage/high threshold voltage transistor (P-LV High Vt) and a p-channel low voltage/low threshold voltage transistor (P-LV Low Vt), respectively operating at a low voltage.

The n-channel middle voltage transistor (N-MV) and p-channel middle voltage transistor (P-MV) transistor are transistors constituting the input/output circuit operating at 2.5 V or 3.3 V. Although the 2.5 V operating transistor and 3.3 V operating transistor have different gate insulating film thicknesses, threshold voltage control conditions and LDD conditions, it is not necessary to mount both the transistors but only one of the transistors is generally mounted. Description will be made in the following on a method for manufacturing the semiconductor device shown in FIG. 4.

Figure 5A:
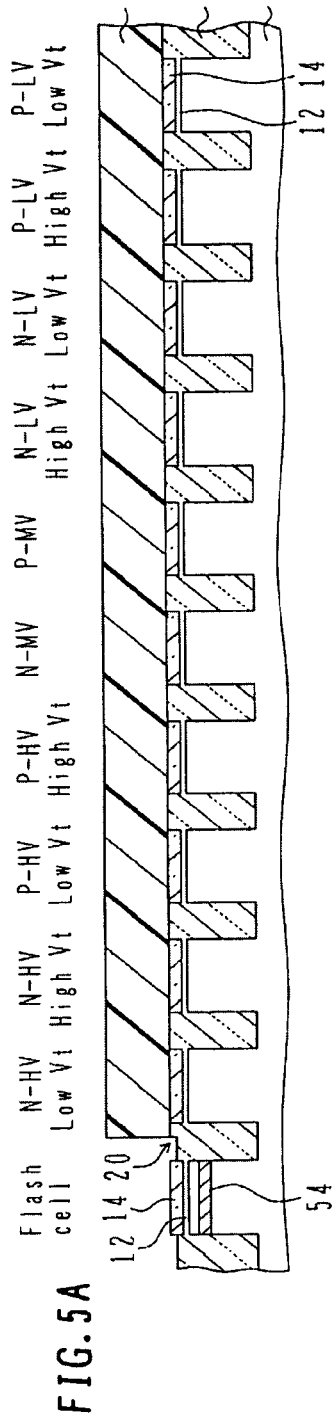

As shown in FIG. 5A, by using the processes described in the third embodiment, patterns of a silicon oxide film 12 and a silicon nitride film 14 are formed on a silicon substrate 10, the silicon substrate 10 is etched to form an isolation trench, and the trench is filled with a silicon oxide film. The silicon oxide film at a level above the silicon nitride film 14 is removed by CMP. An STI isolation region 22 is therefore formed. In this state, a resist pattern 15 exposing the memory area is formed on the substrate. By using the resist pattern 15 as a mask, boron ions for threshold voltage control are implanted at an acceleration energy of 40 keV and a dose of $6\times10^{13}$ cm$^{-2}$ to form a p-type region.

By using the resist pattern 15 as an etching mask, the STI silicon oxide film 22 is etched, for example, by 40 nm in depth. The surface of the STI silicon oxide film 22 in the memory area is therefore lowered and a step 20 is formed.

The resist pattern 15 is removed, and the silicon nitride film 14 and silicon oxide film 12 in the whole area are etched and removed. Processes after this etching process are basically similar to those of the first embodiment. The illustration of the step 20 is dispensed with in the following drawings for the purposes of simplicity.

Figure 5B:
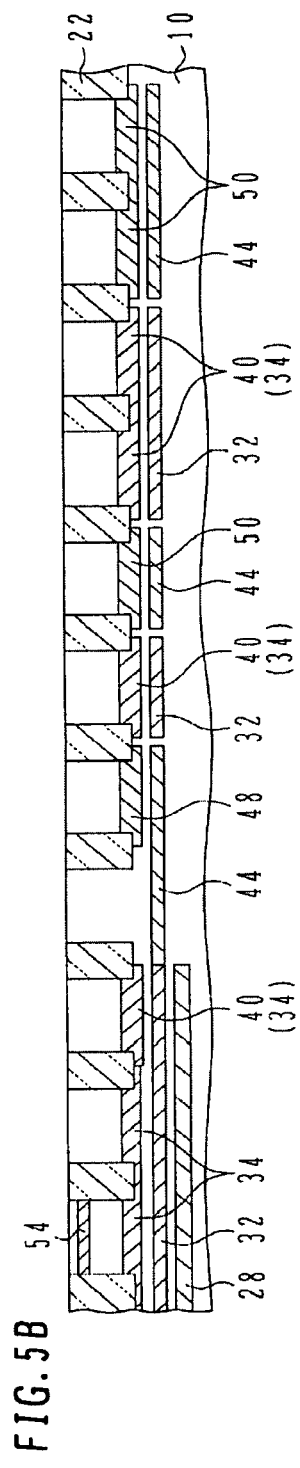

As shown in FIG. 5B, the STI silicon oxide film 22 defines active regions. A silicon oxide sacrificial film is formed by thermal oxidation.

An n-type buried impurity layer 28 is formed in the flash memory cell (Flash cell) area and n-channel high voltage transistor (N-HV) forming area. For example, the n-type buried impurity layer 28 is formed by implanting phosphorus (P$^+$) ions under the conditions of an acceleration energy of 2 MeV and a dose of $2\times10^{13}$ cm$^{-2}$. P-type well impurity layers 32 and 34 are formed in the flash memory cell (Flash cell) area and n-channel transistor forming areas (N-HV, N-MV, N-LV). The p-type well impurity layer 32 is formed, for example, by implanting boron (B$^+$) ions under the conditions of an acceleration energy of 400 keV and a dose of $1.5\times10^{13}$ cm$^{-2}$. The p-type well impurity layer 34 is formed, for example, by implanting boron ions under the conditions of an acceleration energy of 100 keV and a dose of $2\times10^{12}$ cm$^{-2}$.

A p-type well impurity layer 40 is formed in the n-channel high voltage/high threshold voltage transistor (N-HV High Vt) forming area, n-channel middle voltage transistor (N-MV) forming area, and n-channel low voltage transistor (N-LV) forming area. The p-type well impurity layer 40 is formed, for example, by implanting boron ions under the conditions of an acceleration energy of 100 keV and a dose of $6\times10^{12}$ cm$^{-2}$.

An n-type well impurity layer 44 is formed in the p-channel transistor (P-HV, P-MV, P-LV) forming areas. The n-type well impurity layer 44 is formed, for example, by implanting phosphorus ions under the conditions of an acceleration energy of 600 keV and a dose of $3\times10^{13}$ cm$^{-2}$. Under these conditions, the p-channel high voltage/low threshold voltage transistor (P-HV Low Vt) can be obtained which has a threshold voltage of about −0.2 V. A threshold voltage control impurity diffusion layer 48 is formed in the p-channel high voltage/high threshold voltage transistor (P-HV High Vt) forming area. A channel stop layer 50 is formed in the p-channel middle voltage transistor (P-MV) forming area and p-channel low voltage transistor (P-LV) forming area. The threshold voltage control impurity layer 48 and channel stop layer 50 are formed, for example, by implanting phosphorus ions under the conditions of an acceleration energy of 240 keV and a dose of $5\times10^{12}$ cm$^{-2}$. Under these conditions, the p-channel high voltage/high threshold voltage transistor (P-HV High Vt) can be obtained which has a threshold voltage of about −0.6 V. After completion of ion implantation, the silicon oxide sacrificial film is removed.

Figure 5C:
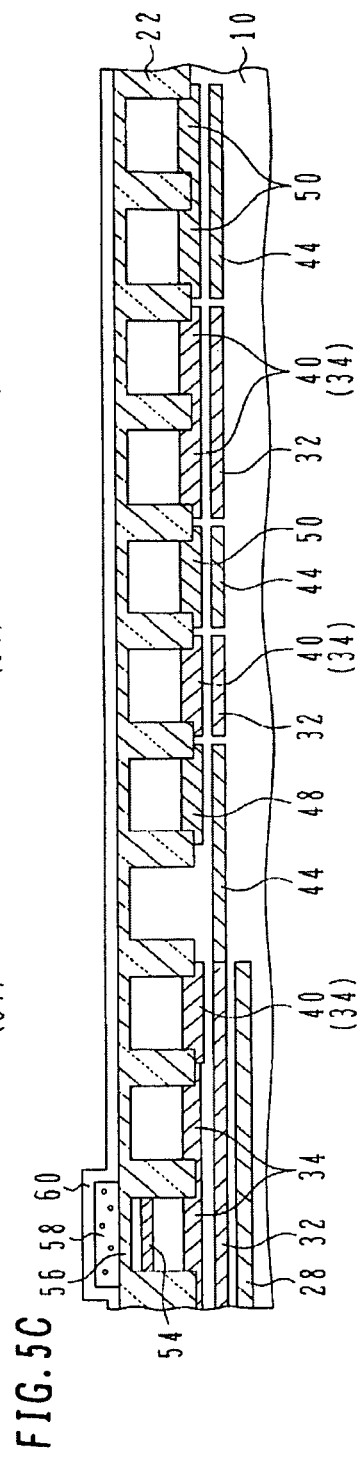

As shown in FIG. 5C, thermal oxidation is performed, for example, for 30 minutes at a temperature of 900 to 1050° C. to form a tunneling silicon oxide film 56 having a thickness of 10 nm on the active region. A phosphorus-doped polysilicon film having a thickness of, e.g., 90 nm is grown on the substrate by CVD, covering the tunneling silicon oxide film 56. The phosphorus-doped polysilicon film is patterned by photolithography and dry etching to form a floating gate 58 made of the phosphorus-doped polysilicon film in the flash memory cell (Flash cell) forming area.

A silicon oxide film having a thickness of, e.g., 5 nm and a silicon nitride film having a thickness of, e.g., 10 nm are grown by CVD on the substrate formed with the floating gate 58. The surface of the silicon nitride film is thermally oxidized for 90 minutes at a temperature of 950° C. to grow an oxide film having a thickness of about 5 nm on the surface of the silicon nitride film and thereby form an ONO film (silicon oxide film/silicon nitride film/silicon oxide film) 60 having a thickness of about 15 nm in total.

As shown in FIG. 5D, ion implantation for threshold voltage control is performed in the transistor areas to obtain desired threshold voltages. A threshold voltage control impurity layer 64 is formed in the n-channel middle voltage transistor (N-MV) forming area. The threshold voltage control impurity layer 64 is formed, for example, by implanting boron ions under the conditions of an acceleration energy of 30 keV and a dose of $5\times10^{12}$ cm$^{-2}$ to obtain a threshold voltage of about +0.3 to +0.4V. A threshold voltage control impurity layer 68 is formed in the p-channel middle voltage transistor (P-MV) forming area. The threshold voltage control impurity layer 68 is formed, for example, by implanting arsenal (As$^+$) under the conditions of an acceleration energy of 150 keV and a dose of $3\times10^{12}$ cm$^{-2}$ to obtain a threshold voltage of about −0.3 to −0.4V.

A threshold voltage control impurity layer 72 is formed in the n-channel low voltage/high threshold voltage transistor (N-LV High Vt) forming area. The threshold voltage control impurity layer 72 is formed, for example, by implanting boron ions under the conditions of an acceleration energy of 10 keV and a dose of $5\times10^{12}$ cm$^{-2}$ to obtain a threshold voltage of about +0.2V. A threshold voltage control impurity layer 76 is formed in the p-channel low voltage/high threshold voltage transistor (P-LV High Vt) forming area. The threshold voltage control impurity layer 76 is formed, for example, by implanting arsenic (As$^+$) under the conditions of an acceleration energy of 100 keV and a dose of $5\times10^{12}$ cm$^{-2}$ to obtain a threshold voltage of about −0.2V.

Next, a photoresist film 92 covering the flash memory cell (Flash cell) forming area and exposing the other areas is formed by photolithography. By using the photoresist film 92 as a mask, the ONO film 60 is etched, for example, by dry etching to remove the ONO film 60 in the areas other than the flash memory cell (Flash cell) forming area. Next, by using the photoresist film 92 as a mask, the tunneling silicon oxide film 56 is etched, for example, by wet etching using hydrofluoric acid aqueous solution, to remove the tunneling silicon oxide film 56 in the areas other than the flash memory cell (Flash cell) forming area. Thereafter, the photoresist film 92 is removed, for example, by ashing.

As shown in FIG. 5E, thermal oxidation is performed at a temperature of, e.g., 850° C. to form a silicon oxide film having a thickness of 13 nm on the active regions. A photoresist film 96 is formed which covers the flash memory cell (Flash cell) forming area and high voltage transistor (N-HV, P-HV) forming areas and exposing other areas. By using the photoresist film 96 as a mask, the silicon oxide film 94 is etched, for example, by wet etching using hydrofluoric acid aqueous solution, to remove the silicon oxide film 94 in the middle voltage transistor (N-MV, P-MV) forming areas and low voltage transistor (N-LV, P-LV) forming areas. Thereafter, the photoresist film 96 is removed, for example, by ashing.

As shown in FIG. 5F, thermal oxidation is performed at a temperature of, e.g., 850° C. to form a silicon oxide film 98 having a thickness of 4.5 nm on the active regions in the middle voltage transistor (N-MV, P-MV) forming areas and low voltage transistor (N-LV, P-LV) forming areas. With this thermal oxidation process, a thickness of the silicon oxide film 94 increases also.

A photoresist film 100 is formed which covers the flash memory cell (Flash cell) forming area, high voltage transistor (N-HV, P-HV) forming areas and middle voltage transistor (N-MV, P-MV) forming areas and exposing other areas. By using the photoresist film 100 as a mask, the silicon oxide film 98 is etched, for example, by wet etching using hydrofluoric acid aqueous solution, to remove the silicon oxide film 98 in the low voltage transistor (N-LV, P-LV) forming areas. Thereafter, the photoresist film 100 is removed, for example, by ashing.

As shown in FIG. 5G, thermal oxidation is performed at a temperature of, e.g., 850° C. to form a gate insulating film 102 made of a silicon oxide film having a thickness of 2.2 nm on the active regions in the low voltage transistor (N-LV, P-LV) forming areas. With this thermal oxidation process, thicknesses of the silicon oxide films 94 and 98 increase also, gate insulating films each having a total thickness of 16 nm are formed in the high voltage transistor (N-HV, P-HV) forming areas, and gate insulating films each having a total thickness of 5.5 nm are formed in the middle voltage transistor (N-MV, P-MV) forming areas.

A polysilicon film 108 having a thickness of, e.g., 180 nm is grown by CVD. Next, a silicon nitride film 110 having a thickness of, e.g., 30 nm is grown on the polysilicon film 108. The silicon nitride film 110 serves as an antireflection layer and an etching mask when the lower polysilicon film 108 is patterned, and at the same time has a role of protecting gate electrodes in the logic area when the side wall of the gate electrode of the flash memory cell is oxidized as will be later described.

The silicon nitride film 110, polysilicon film 108, ONO film 60 and floating gate 58 in the flash memory cell (Flash cell) forming area are patterned by photolithography and dry etching to form a gate electrode 112 of the flash memory cell (Flash cell).

As shown in FIG. 5H, the side walls of the gate electrode 112 of the flash memory cell (Flash cell) are thermally oxidized by about 10 nm, and ion implantation is performed for source/drain regions 114. The side walls of the gate electrode 112 are again thermally oxidized by about 10 nm. Next, after a silicon nitride film is deposited, for example, by thermal CVD, this silicon nitride film and silicon nitride film 110 are etched back to form side wall insulating films 116 of the silicon nitride film and at the same time expose the surface of the polysilicon film 108. Next, the polysilicon film 108 in the high voltage transistor (N-HV, P-HV) forming areas, middle voltage transistor (N-MV, P-MV) transistor forming areas and low voltage transistor (N-LV, P-LV) transistor forming areas are patterned by photolithography and dry etching to form gate electrodes 118 made of the polysilicon film 108.

As shown in FIG. 5I, source/drain regions S/D of each transistor of the logic circuit are formed. Extensions of the source/drain regions of the p-channel low voltage transistor (P-LV) are formed. For example, an extension with a pocket is formed by implanting boron ions at an acceleration energy of 0.5 keV and a dose of $3.6\times10^{14}$ cm$^{-2}$ and arsenic ions at an acceleration energy of 80 keV and a dose of $6.5\times10^{12}$ cm$^{-2}$, respectively along four directions tilted by 28 degrees from the substrate normal. Extensions of the source/drain regions of the n-channel low voltage transistor (N-LV) are formed. For example, an extension with a pocket is formed by implanting arsenic ions at an acceleration energy of 3 keV and a dose of $1.1\times10^{15}$ cm$^{-2}$ and boron fluoride (BF$_2^+$) ions at an acceleration energy of 35 keV and a dose of $9.5\times10^{12}$ cm$^{-2}$, respectively along four directions tilted by 28 degrees from the substrate normal.

Extensions of the source/drain regions of the p-channel middle voltage transistor (P-MV) are formed, for example, by implanting boron fluoride ions under the conditions of an acceleration energy of 10 keV and a dose of $7\times10^{13}$ cm$^{-2}$. Extensions of the source/drain regions of the n-channel middle voltage transistor (N-MV) are formed, for example, by implanting arsenic ions under the conditions of an acceleration energy of 10 keV and a dose of $2\times10^{13}$ cm$^{-2}$, or implanting phosphorus ions under the conditions of an acceleration energy of 10 keV and a dose of $3\times10^{13}$ cm$^{-2}$.

Extensions of the source/drain regions of the p-channel high voltage transistor (P-HV) are formed, for example, by implanting boron fluoride ions under the conditions of an acceleration energy of 80 keV and a dose of $4.5\times10^{13}$ cm$^{-2}$. Extensions of the source/drain regions of the n-channel high voltage transistor (N-HV) are formed, for example, by implanting phosphorus ions under the conditions of an acceleration energy of 35 keV and a dose of $4\times10^{13}$ cm$^{-2}$.

After a silicon oxide film is deposited by thermal CVD, this silicon oxide film is etched back to form side wall insulating films 144 of the silicon oxide film on side walls of each transistor.

By using a photoresist film as a mask, ion implantation is performed to form source/drain regions S/D of the flash memory cell (Flash cell) and n-channel transistors. With this ion implantation, the gate electrodes of the flash memory cell and n-channel transistors are doped to become an n-type. The source/drain regions are formed, for example, by implanting phosphorus ions under the conditions of an acceleration energy of 10 keV and a dose of $6\times10^{15}$ cm$^{-2}$.

Source/drain regions S/D of p-channel transistors are formed. With this ion implantation, the gate electrodes of the p-channel transistors are doped to become a p-type. The source/drain regions are formed, for example, by implanting boron ions under the conditions of an acceleration energy of 5 keV and a dose of $4\times10^{15}$ cm$^{-2}$. The surfaces of the gate electrode and source/drain regions are silicidated by well-known salicide process. In this manner, transistors of eleven types are formed on the silicon substrate 10.

An insulating film 154 is deposited on the silicon substrate 10 formed with the transistors, and contact holes are formed and filled with conductive plugs 158. A first metal wiring 160 is formed on the insulating film 154.

Figure 5J:
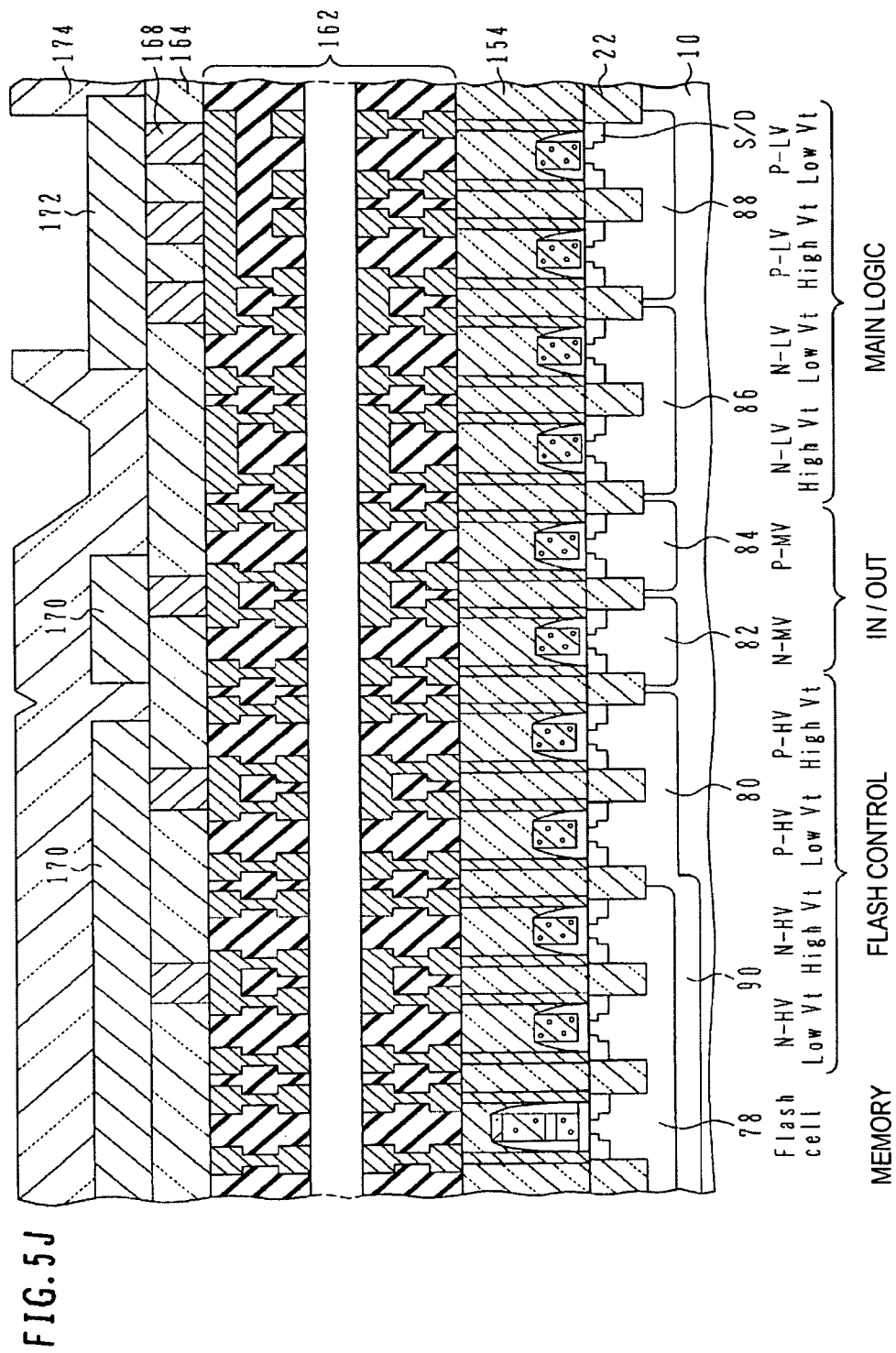

As shown in FIG. 5J, processes of depositing an insulating film and forming wiring etc. are repeated to form a multi-layer wiring layer 162 having the desired number of wiring layers. An insulating film 164 is deposited on the multi-layer wiring layer 162, and contact holes are formed and filled with conductive plugs 168. Wirings 170 connected to the conductive plugs 168 and pad electrodes are formed on the insulating film 164. A passivation film 174 is formed on the insulating film 164 formed with the wiring layer 170, pad electrodes 172 etc., and opening apertures for the pad electrodes are formed. In this manner, a semiconductor device is completed. Various publicly known processes can be used for manufacture processes for flash memory cells, logic transistors, and multi-layer wirings. For example, reference is made to Japanese Patent Laid-open Publication No. 2005-142362 which is incorporated herein by reference.

Although the semiconductor device mixedly mounting a flash memory is constituted of transistors of eleven types, the embodiments are not limited thereto. The number of types of transistors may be increased or decreased as desired, and the memory is also not limited to a flash memory.

Although the invention has been described in connection with the embodiments, the invention is not limited thereto. The invention is expected to be widely applied to the case in which structures having different heights are formed and patterned on a plurality of active regions defined by an STI isolation region. Although gate electrodes of a flash memory and MOS transistor have been described as examples of the structures having different heights, the invention is expected to be effective for a conductor structure having different numbers of layers, e.g., a conductor structure mixing a single layer structure and a lamination structure. Circuits to be formed may be selected in various ways. Further, it is obvious for these skilled in the art that various modifications, improvements, combinations and the like are possible.

INDUSTRIAL APPLICATION FIELD

The invention is applicable to a semiconductor integrated circuit in which structures having different heights are formed and patterned on a plurality of active regions defined by an STI isolation region. The invention is applicable particularly to a semiconductor device having a nonvolatile memory with floating gates.

What we claim are:

1. A semiconductor device comprising:
   a semiconductor substrate including a memory cell area and a logic circuit area;
   an isolation trench formed in the semiconductor substrate, the isolation trench defining a first active region in the memory cell area and a second active region in the logic circuit area;
   an insulating film formed in the isolation trench and including a step between the first active region and the second active region;
   a floating gate formed on the first active region and the insulating film in an area nearby the first active region;
   an inter-gate insulating film formed on the floating gate;
   a control gate formed on the inter-gate insulating film; and
   a gate electrode formed on the second active region and the insulating film in an area nearby the second active region,
   wherein a height from a surface of the first active region to a surface of the insulating film in the memory cell area is smaller than a height from a surface of the second active region to a surface of the insulating film in the logic circuit area,
   the surface of the insulating film in the logic circuit area is higher than the surface of the second active region, and
   an edge of the floating gate is located on the insulating film and between the step and the first active region.

2. The semiconductor device according to claim 1, further comprising:
   a first gate insulating film formed on the first active region and having a first thickness;
   a second gate insulating film formed on the second active region and having a second thickness which is different from the first thickness.

3. The semiconductor device according to claim 2, further comprising:
   a first concave portion formed in the insulating film near a boundary between the first active region and the insulating film; and
   a second concave portion formed in the insulating film near a boundary between the second active region and the insulating film.

4. The semiconductor device according to claim 3, wherein:
   a depth of the first concave portion from the surface of the first active region is smaller than a depth of the second concave portion from the surface of the second active region.

5. The semiconductor device according to claim 1, further comprising:
   a dummy floating gate formed on the step and including a same material as a material of the floating gate.

6. The semiconductor device according to claim 5, further comprising:
   a dummy inter-gate insulating film partially formed on the dummy floating gate and made of a same material as a material of the inter-gate insulating film; and
   a dummy control gate formed on the dummy inter-gate insulating film and the dummy floating gate and made of a same material as a material of the control gate.

7. The semiconductor device according to claim 1, wherein the memory cell area is located adjacent to the logic circuit area.

* * * * *